US012787790B2

(12) United States Patent
Seol et al.

(10) Patent No.: US 12,787,790 B2
(45) Date of Patent: Nov. 3, 2026

(54) SEMICONDUCTOR PACKAGE HAVING AN ANTENNA PATTERN ON A MOLD LAYER

(71) Applicant: Samsung Electronics Co., Ltd., Suwon-si (KR)

(72) Inventors: Yongjin Seol, Seongnam-si (KR); Seonhyang You, Hwaseong-si (KR); Wonjae Lee, Yongin-si (KR); Wooik Jang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 678 days.

(21) Appl. No.: 17/844,802

(22) Filed: Jun. 21, 2022

(65) Prior Publication Data

US 2023/0142196 A1 May 11, 2023

(30) Foreign Application Priority Data

Nov. 11, 2021 (KR) ........................ 10-2021-0154740

(51) Int. Cl.
*H10W 44/20* (2026.01)
*H10W 70/63* (2026.01)
*H10W 74/10* (2026.01)
*H10W 74/40* (2026.01)

(52) U.S. Cl.
CPC ......... *H10W 44/20* (2026.01); *H10W 70/635* (2026.01); *H10W 74/111* (2026.01); *H10W 74/40* (2026.01)

(58) Field of Classification Search
CPC ..... H01L 23/66; H01L 23/29; H01L 23/3107; H01L 23/3121; H01L 23/3128; H01L 23/5389; H01L 23/49827; H01L 23/49822; H01L 23/49816; H01L 21/6835; H01L 21/56; H01L 24/16; H01L 2221/68345; H01L 2221/68359; H01L 2223/6677; H01Q 1/52; H01Q 1/2283; H01Q 21/065
See application file for complete search history.

(56) References Cited

U.S. PATENT DOCUMENTS

| | | | |
|---|---|---|---|
| 10,483,618 | B2 | 11/2019 | Park et al. |
| 10,685,922 | B2 | 6/2020 | Lin et al. |
| 10,872,867 | B2 | 12/2020 | Chen et al. |
| 10,897,811 | B2 | 1/2021 | Hong et al. |

(Continued)

FOREIGN PATENT DOCUMENTS

| | | | |
|---|---|---|---|
| KR | 10-2009-0071367 | A | 7/2009 |
| KR | 10-2009-0071482 | A | 7/2009 |

(Continued)

*Primary Examiner* — Wael M Fahmy
*Assistant Examiner* — Tiberiu Dan Onuta
(74) *Attorney, Agent, or Firm* — Muir Patent Law, PLLC

(57) ABSTRACT

A semiconductor package includes a package substrate, a semiconductor chip on the package substrate, a mold layer on the package substrate to cover the semiconductor chip, the mold layer having a first side surface and a first trench disposed at the first side surface, and the first trench extending from a top surface of the mold layer toward a bottom surface of the mold layer, an antenna pattern on the mold layer, and a first connection terminal filling the first trench. The antenna pattern is electrically connected to the package substrate through the first connection terminal.

17 Claims, 23 Drawing Sheets

(56) References Cited

U.S. PATENT DOCUMENTS

| | | | | |
|---|---|---|---|---|
| 2008/0290479 | A1* | 11/2008 | Hong | H10W 95/00 438/111 |
| 2009/0140394 | A1* | 6/2009 | Bathan | H10P 72/74 257/621 |
| 2009/0166785 | A1* | 7/2009 | Camacho | H10F 39/804 257/E31.124 |
| 2017/0294697 | A1* | 10/2017 | Jou | G02F 1/025 |
| 2021/0202407 | A1* | 7/2021 | Lau | H01Q 1/2283 |
| 2022/0359420 | A1* | 11/2022 | Kim | H01Q 1/2283 |

FOREIGN PATENT DOCUMENTS

| | | | |
|---|---|---|---|
| KR | 101341436 | B1 | 1/2014 |
| KR | 10-2019-0050155 | A | 5/2019 |
| KR | 1020200119730 | A | 10/2020 |

* cited by examiner

SEMICONDUCTOR PACKAGE HAVING AN ANTENNA PATTERN ON A MOLD LAYER

CROSS-REFERENCE TO RELATED APPLICATIONS

This U.S. non-provisional patent application claims priority under 35 U.S.C. § 119 to Korean Patent Application No. 10-2021-0154740, filed on Nov. 11, 2021, in the Korean Intellectual Property Office, the entire contents of which are hereby incorporated by reference.

TECHNICAL FIELD

The present disclosure relates to a semiconductor package and a method of fabricating the same, and in particular, to a semiconductor package including an antenna and a method of fabricating the same.

DISCUSSION OF RELATED ART

With the recent advance in the electronics industry, demands for high-performance, high-speed, and compact electronic components are increasing. To meet this demand, packaging technologies of mounting a plurality of semiconductor chips and other electric components in a single package are being developed.

As demands for an electronic device with high performance increase, the frequency and bandwidth of components used in mobile devices, such as smart phones, are also increasing. In particular, for an antenna module for mm-wave and 5G communication, it is desirable to reduce the size of the module and to minimize interference between components in the antenna module. Furthermore, in order to increase a degree of freedom in designing a mounting position in a set product, there is no choice but to put many restrictions on the size and thickness of the module.

SUMMARY

Some embodiments of the inventive concepts provide a semiconductor package with improved electric characteristics and a small size and a method of fabricating the same.

Some embodiments of the inventive concepts provide a method of fabricating a semiconductor package at a low failure rate and a semiconductor package fabricated thereby.

Some embodiments of the inventive concepts provide a method of simplifying a process of fabricating a semiconductor package and a semiconductor package fabricated thereby.

According to some embodiment of the inventive concepts, a semiconductor package includes a package substrate, a semiconductor chip on the package substrate, a mold layer on the package substrate to cover the semiconductor chip, the mold layer having a first side surface and a first trench disposed at the first side surface, and the first trench extending from a top surface of the mold layer toward a bottom surface of the mold layer, an antenna pattern on the mold layer, and a first connection terminal filling the first trench. The antenna pattern is electrically connected to the package substrate through the first connection terminal.

According to some embodiment of the inventive concepts, a semiconductor package includes a package substrate provided with a substrate pad, a semiconductor chip on the package substrate, a mold layer on the package substrate to cover the semiconductor chip, an antenna pattern on the mold layer, and a connection terminal extending along a first side surface of the mold layer toward the package substrate and connecting the antenna pattern to the substrate pad. The substrate pad includes a first side surface that is vertically aligned with the first side surface of the mold layer.

According to some embodiment of the inventive concepts, a method of fabricating a semiconductor package includes mounting a plurality of semiconductor chips on a package substrate provided with a plurality of preliminary substrate pads, forming a mold layer on the package substrate to cover the plurality of semiconductor chips and the plurality of preliminary substrate pads, forming a preliminary antenna pattern on the mold layer overlapping the plurality of preliminary substrate pads, forming a plurality of penetration holes to vertically penetrate the mold layer and the preliminary antenna pattern to expose the plurality of preliminary substrate pads of the package substrate, respectively, wherein the preliminary antenna pattern is separated into a plurality of antenna patterns, filling each of the plurality of penetration holes with a conductive material to form a plurality of preliminary connection terminals connecting the plurality of preliminary substrate pads to the plurality of antenna patterns, respectively, and performing a singulation process on the mold layer and the package substrate to form a plurality of semiconductor packages. The plurality of preliminary connection terminals and the plurality of preliminary substrate pads are cut into a plurality of connection terminals and a plurality of substrate pads, respectively, during the singulation process such that each semiconductor chip of the plurality of semiconductor packages has at least one connection terminal among the plurality of connection terminals and at least one substrate pad among the plurality of substrate pads.

DETAILED DESCRIPTION

Example embodiments of the inventive concepts will now be described more fully with reference to the accompanying drawings, in which example embodiments are shown.

Figure 1:
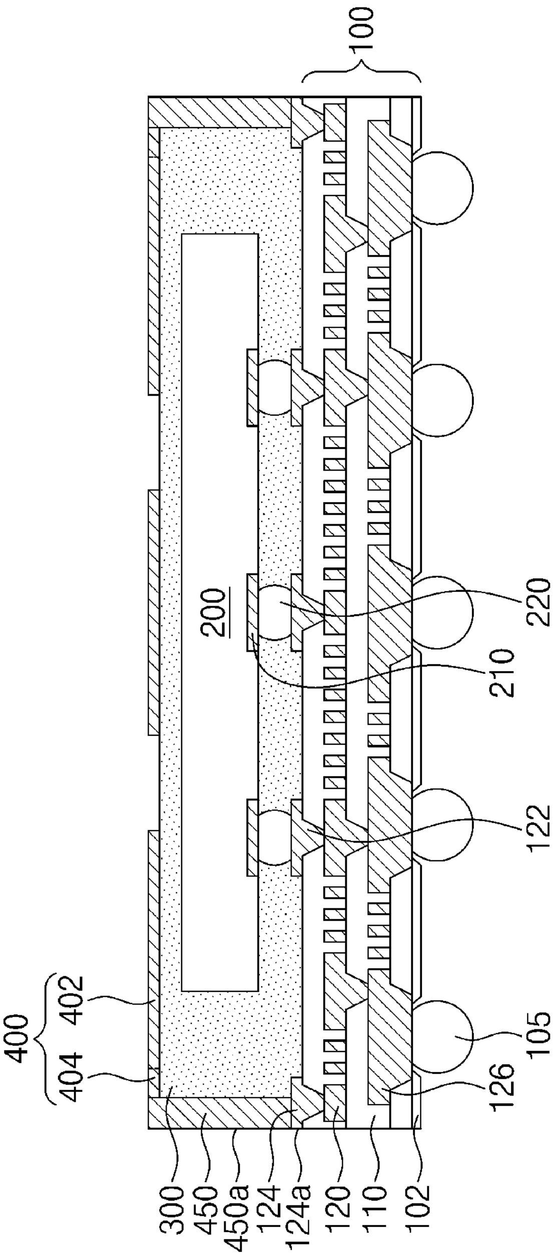
FIGS. 1 and 2 are sectional views illustrating a semiconductor package according to some embodiments of the inventive concepts.
Figure 2:
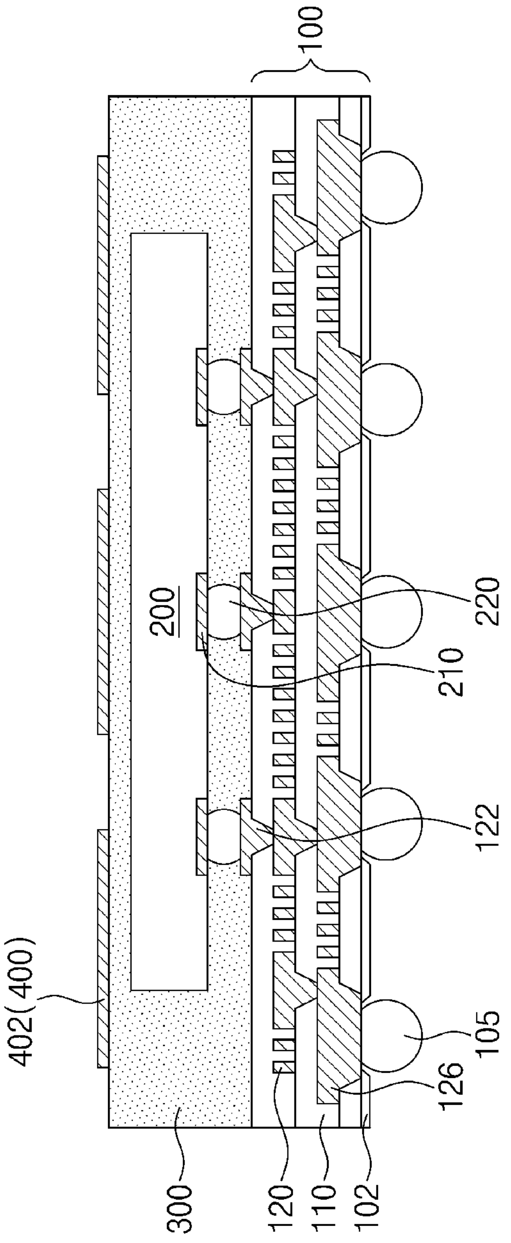
Figure 3:
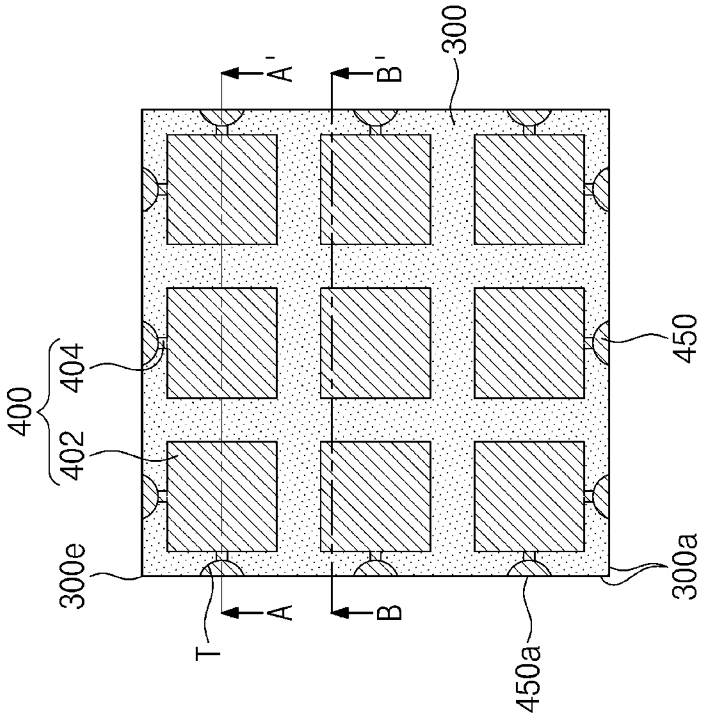
FIG. 3 is a plan view illustrating a semiconductor package according to some embodiments of the inventive concepts.
Figure 4:
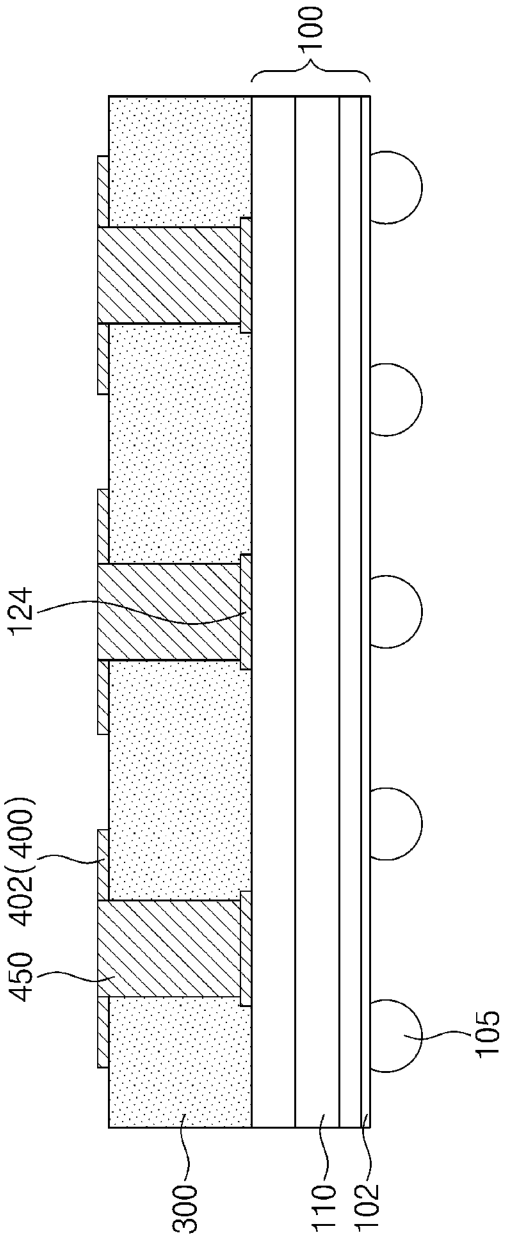
FIG. 4 is a side view illustrating a semiconductor package according to some embodiments of the inventive concepts.
Figure 5:
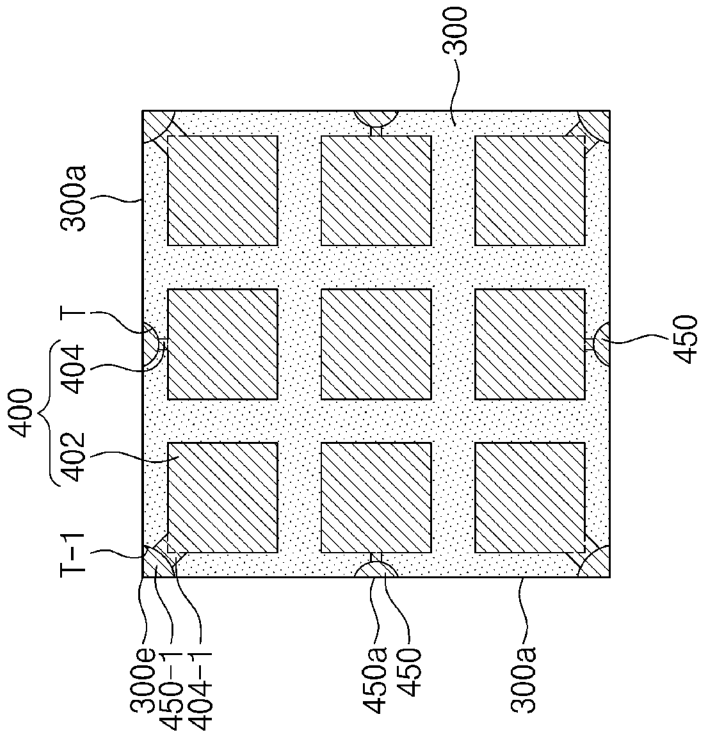
FIG. 5 is a plan view illustrating a semiconductor package according to some embodiments of the inventive concepts.

FIGS. 1 and 2 are sectional views illustrating a semiconductor package according to some embodiments of the inventive concepts. FIG. 3 is a plan view illustrating a semiconductor package according to some embodiments of the inventive concepts. Here, FIG. 1 is a sectional view taken along line A-A' of FIG. 3, and FIG. 2 is a sectional view taken along line B-B' of FIG. 3. FIG. 4 is a side view illustrating a structure of a semiconductor package, which is viewed in a lateral direction, according to some embodiments of the inventive concepts. FIG. 5 is a plan view illustrating a semiconductor package according to some embodiment of the inventive concepts.

Referring to FIGS. 1 to 4, a package substrate 100 may be provided. The package substrate 100 may be a redistribution substrate. In some embodiments, the package substrate 100 may include one or more substrate interconnection layers, which are sequentially stacked on each other. Each substrate interconnection layer may include a substrate insulating pattern 110 and a substrate interconnection pattern 120, which is provided in the substrate insulating pattern 110. The substrate interconnection pattern 120 of one substrate interconnection layer may be electrically connected to the substrate interconnection pattern 120 of another substrate interconnection layer. Hereinafter, the structure of the package substrate 100 will be described in more detail with reference to one of the substrate interconnection layers. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. As used herein, components described as being "electrically connected" are configured such that an electrical signal can be transferred from one component to the other (although such electrical signal may be attenuated in strength as it transferred and may be selectively transferred).

The substrate insulating pattern 110 may be formed of or include an insulating polymer or a photoimageable dielectric (PID). For example, the photoimageable dielectric may be formed of or include at least one of photoimageable polyimide (PI), polybenzoxazole (PBO), phenol-based polymers, and benzocyclobutene-based polymers. In some embodiments, the substrate insulating pattern 110 may include or may be formed of an insulating material. For example, the substrate insulating pattern 110 may be formed of or include at least one of silicon oxide (SiO), silicon nitride (SiN), silicon oxynitride (SiON), and insulating polymers.

The substrate interconnection pattern 120 may be provided on the substrate insulating pattern 110. The substrate interconnection pattern 120 may be horizontally extended on the substrate insulating pattern 110. The substrate interconnection pattern 120 may be an element for an internal redistribution of the substrate interconnection layer. The substrate interconnection pattern 120 may be formed of or include a conductive material. For example, the substrate interconnection pattern 120 may be formed of or include copper (Cu).

The substrate interconnection pattern 120 may have a damascene structure. For example, the substrate interconnection pattern 120 may include a head portion and a tail portion which are connected to form a single object. The head and tail portions may be provided to have no interface therebetween. Here, a width of the head portion, which is connected to the tail portion, may be larger than a width of the tail portion. Thus, the head and tail portions of the substrate interconnection pattern 120 may have a 'T'-shaped section.

The head portion of the substrate interconnection pattern 120 may be a wire or pad portion which is used to horizontally expand an interconnection line in the package substrate 100. The head portion may be provided on a top surface of the substrate insulating pattern 110. For example, the head portion may protrude above the top surface of the substrate insulating pattern 110. The head portion of the substrate interconnection pattern 120 in the uppermost one of the substrate interconnection layers may correspond to first substrate pads 122, which are used to mount a semiconductor chip 200 on the package substrate 100, and second substrate pads 124, which are used for connection with an antenna pattern 400. The second substrate pads 124 may be electrically connected to the semiconductor chip 200 through the package substrate 100, and the semiconductor chip 200 may receive or transmit antenna input/output signals or the like through the second substrate pads 124. In the case where it is necessary to connect the antenna pattern 400 to an external RF device, some of the second substrate pads 124 may be connected to outer terminals 105 to be described below. The first substrate pads 122 may be disposed on a center region of the package substrate 100, and the second substrate pads 124 may be disposed on an outer edge region of the package substrate 100. Each of the second substrate pads 124 may be in contact with one of side surfaces of the package substrate 100. For example, the second substrate pads 124 may have side surfaces **124*a* that are exposed to the outside, near the side surfaces of the package substrate 100. In some embodiments, each of the second substrate pads 124 may have a side surface 124*a* that is vertically aligned with a corresponding side surface of the package substrate 100**.

The tail portion of the substrate interconnection pattern 120 may be a via portion, which is used to vertically connect interconnection lines in the package substrate 100 with each other. The tail portion may be connected to a bottom surface of the head portion. The tail portion may be coupled to another substrate interconnection layer placed thereunder. For example, the tail portion of the substrate interconnection pattern 120 may be extended from the bottom surface of the head portion to penetrate the substrate insulating pattern 110 and may be coupled to the head portion of the substrate interconnection pattern 120 of another substrate interconnection layer thereunder. The tail portion of the substrate interconnection pattern 120 in the lowermost one of the substrate interconnection layers may be exposed to the outside of the substrate insulating pattern 110 near a bottom surface of the substrate insulating pattern 110. The tail portion of the substrate interconnection pattern 120, which is placed at the lowermost level and is exposed to the outside near the bottom surface of the substrate insulating pattern 110, may correspond to under-bump pads 126, which are used to connect outer terminals 105 to the package substrate 100.

A protection layer 102 may be provided below the lowermost one of the substrate interconnection layers. The protection layer 102 may cover the bottom surface of the lowermost one of the substrate interconnection layers. The protection layer 102 may be used to protect a bottom surface of the package substrate 100. Here, the under-bump pads 126 may be exposed to the outside of the protection layer 102 through a recess formed in the protection layer 102. The recess may be an empty region, in which the outer terminal 105 is provided. The protection layer 102 may be formed of or include at least one of insulating materials. For example, the protection layer 102 may include or may be formed of at least one of insulating polymers (e.g., epoxy-based polymer), Ajinomoto build-up film (ABF), organic materials, and inorganic materials.

Outer terminals 105 may be disposed below the package substrate 100. For example, the outer terminals 105 may be disposed on the under-bump pads 126, which are provided near the bottom surface of the package substrate 100. For example, the outer terminals 105 may be placed in the recesses, which are formed in the protection layer 102, and may be coupled to bottom surfaces of the under-bump pads 126. The outer terminals 105 may include solder balls or solder bumps, and according to the kind or arrangement of the outer terminals 105, the semiconductor package may have a ball-grid-array (BGA) structure, a fine ball-grid array (FBGA) structure, or a land grid array (LGA) structure.

The semiconductor chip 200 may be disposed on the package substrate 100. The semiconductor chip 200 may be disposed on a top surface of the package substrate 100. Integrated circuit of the semiconductor chip 200 may include a radio frequency integrated circuit (RF IC). The semiconductor chip 200 may be electrically connected to the antenna pattern 400 to be described below, and in this case, antenna signals may be emitted in various directions. In some embodiments, the integrated circuit of the semiconductor chip 200 may include a plurality of electronic components. For example, the integrated circuit may further include various electronic components (e.g., a power management integrated circuit (PMIC), a modem, a transceiver, a power amp module (PAM), a frequency filter, or a low noise amplifier (LNA)), which are used to drive the radio frequency integrated circuit. In the semiconductor chip 200, the integrated circuit, which includes the radio frequency integrated circuit and the electronic components, may convert digital signals (e.g., baseband signals and so forth) which are transmitted from the outside thereof, to analog signal (e.g., high frequency signals and so forth) and may output the converted signals to the antenna pattern 400. In some embodiments, the semiconductor chip 200 may include a memory chip, a logic chip, or a passive element. The semiconductor chip 200 may be disposed on the package substrate 100 in a face down manner. For example, the semiconductor chip 200 may have a front surface facing the package substrate 100 and a rear surface, which is opposite to the front surface. Hereinafter, in the present specification, the front surface may be a surface of a semiconductor chip, which is called an active surface, and on which integrated devices or pads are formed, and the rear surface may be another surface of a semiconductor chip that is opposite to the front surface. According to the afore-described positions of the package substrate 100 and the semiconductor chip 200, a bottom surface of the semiconductor chip 200 may correspond to a front surface of the semiconductor chip 200, and a top surface of the semiconductor chip 200 may correspond to a rear surface of the semiconductor chip 200. The semiconductor chip 200 may be formed of or include a semiconductor material (e.g., silicon (Si)).

The semiconductor chip 200 may include chip pads 210, which are provided on the bottom surface thereof. The chip pads 210 may be electrically connected to the integrated device or the integrated circuits in the semiconductor chip 200.

The semiconductor chip 200 may be mounted on the package substrate 100. The semiconductor chip 200 may be mounted on the package substrate 100 in a flip chip manner. For example, the front surface of the semiconductor chip 200 may face the package substrate 100. Here, chip terminals 220 may be provided below the chip pads 210 of the semiconductor chip 200. The semiconductor chip 200 may be mounted on the package substrate 100 through the chip terminals 220. The chip terminals 220 may connect the chip pads 210 of the semiconductor chip 200 to the first substrate pads 122 of the package substrate 100. In some embodiments, the semiconductor chip 200 may be mounted on the package substrate 100 in a wire bonding manner. For example, the semiconductor chip 200 may be provided on the package substrate 100 in a face-up way that that the chip pads 210 are placed at an upper level, and in this case, the semiconductor chip 200 may be electrically connected to the package substrate 100 through bonding wires, which are provided to connect the chip pads 210 to the first substrate pads 122.

FIG. 1 illustrates an example in which only the semiconductor chip 200 is mounted on the package substrate 100, but the inventive concept is not limited to this example. The semiconductor chip 200 may receive and transmit the antenna input/output signals or the like through the second substrate pads 124. Here, in the case where the semiconductor chip 200 includes an antenna device, such as RF IC, at least one of additional elements (e.g., an RF switch, a filter, a PAM, and passive elements for impendence matching) may be placed on an electric path between the semiconductor chip 200 and the second substrate pads 124. For example, the antenna pattern 400 electrically connected to the package substrate 100 may be connected to the semiconductor chip 200 through the RF switch, the filter, the passive elements, and the PAM. In some embodiments, the RF switch, the filter, the PAM, and the passive elements, along with the semiconductor chip 200, may be mounted on the package substrate 100. Hereinafter, the inventive concept will be described further with reference to the embodiment of FIG. 1.

A mold layer 300 may be provided on the package substrate 100. The mold layer 300 may cover the top surface of the package substrate 100. The mold layer 300 may be provided to enclose the semiconductor chip 200, when viewed in a plan view. The mold layer 300 may cover not only a side surface of the semiconductor chip 200 but also the top surface (i.e., the rear surface) of the semiconductor chip 200. In other words, the top surface of the semiconductor chip 200 may not be exposed to the outside by the mold layer 300. The mold layer 300 may fill a space between the package substrate 100 and the semiconductor chip 200. Between the package substrate 100 and the semiconductor chip 200, the mold layer 300 may enclose the chip terminals 220. On the package substrate 100, the mold layer 300 may cover the second substrate pads 124. The mold layer 300 may have substantially the same planar shape as the package substrate 100. For example, each of side surfaces 300*a* of the mold layer 300 may be coplanar with a corresponding one of the side surfaces of the package substrate 100. In some embodiments, each side surface 300*a* of the mold layer 300 may be vertically aligned with a corresponding side surface of the package substrate 100 (see, FIG. 2). The mold layer 300 may be formed of or include an insulating material (e.g., epoxy molding compound (EMC)). Terms such as “same,” “equal,” “planar,” “flat” or “coplanar,” as used herein encompass near identicality including variations that may occur, for example, due to manufacturing processes. The term “substantially” may be used herein to emphasize this meaning, unless the context or other statements indicate otherwise.

The mold layer 300 may have trenches T, which are formed at the side surfaces 300*a*. As shown in FIGS. 3 and 4, the trenches T may be formed to be recessed from the side surfaces 300*a* toward an inner portion of the mold layer 300. The trenches T may be extended from the top surface of the package substrate 100 (or a bottom surface of the mold layer 300) toward a top surface of the mold layer 300 and may cross along the side surfaces 300*a* of the mold layer 300 in a vertical direction.

In the embodiment of FIG. 3, each of the trenches T may be formed to expose a top surface of a corresponding one of the second substrate pads 124. For example, each of the trench T may be placed on a corresponding one of the second substrate pads 124. In addition, when the top surface of the mold layer 300 is viewed, a planar shape of the trench T may be a semi-circular shape. However, the inventive concept is not limited to this example, and in some embodiments, the trenches T may be provided to have at least one of various shapes (e.g., rectangular shape), when viewed in a plan view.

As shown in FIG. 4, when the side surface 300*a* of the mold layer 300 is viewed in a cross-sectional view, each of the trenches T may have a line shape extended in a direction perpendicular to the package substrate 100. The trenches T may be spaced apart from corners 300*e* of the mold layer 300, where the side surfaces 300*a* meet each other. For example, the trench T may be disposed adjacent to a center region of the side surface 300*a* or between the center region of the side surface 300*a* and the corner 300*e*.

In some embodiments, as shown in FIG. 5, some (hereinafter, corner trenches T-1) of the trenches T may be provided near the corners 300*e* of the mold layer 300. For example, the corner trenches T-1 may be in contact with a pair of the side surfaces 300*a* meeting each other. When viewed in a plan view, each of the corner trenches T-1 may have a sector shape of a circle whose two sides are parallel to the side surfaces 300*a* of the mold layer 300. In this case, some of the second substrate pads 124 may be disposed below the corner trenches T-1 and may be exposed to the outside near a pair of side surfaces of the package substrate 100 corresponding to the pair of the side surfaces 300*a*. In some embodiments, the corner trenches T-1 may be formed at corners 300*e* of the mold layer 300. For example, each corner trench of the corner trenches T-1 may be formed at a corresponding corner of the corners 300*e*. Hereinafter, the inventive concept will be described further with reference to the embodiment of FIG. 3.

Referring further to FIGS. 1 to 4, the antenna pattern 400 may be disposed on the mold layer 300. The antenna pattern 400 may be a planar antenna array, which is composed of a plurality of patch patterns 402 disposed on the top surface of the mold layer 300. The patch patterns 402 may be disposed on the entire top surface of the mold layer 300, and thus, the antenna pattern 400 may vertically overlap the semiconductor chip 200. Each of the patch patterns 402 of the antenna pattern 400 may be a patch antenna. For example, the patch patterns 402 may be arranged on the top surface of the mold layer 300 and may be used for broadside radiation. The patch patterns 402 may be periodically arranged to form a plurality of rows and a plurality of columns, as shown in FIG. 3. FIG. 3 illustrates an example in which nine patch patterns 402 are arranged on the mold layer 300, but the inventive concept is not limited to this example. The number and arrangement of the patch patterns 402 may be variously changed, depending on desired technical features. The patch patterns 402 on the top surface of the mold layer 300 may be disposed to be spaced apart from the trenches T. The patch patterns 402 may have a plate shape of which a planar area is much larger than a sectional area. However, the kind and shape of the antenna formed by the antenna pattern 400 are not limited to those in the afore-described examples, and the antenna pattern 400 may be provided as antennas of various shapes. The antenna pattern 400 may be configured to emit an antenna signal, which is generated by an electrical signal transmitted from the semiconductor chip 200, to the outside or to receive an external signal. The antenna pattern 400 may be formed of or include at least one of conductive materials (e.g., copper (Cu), aluminum (Al), silver (Ag), tin (Sn), gold (Au), nickel (Ni), lead (Pb), titanium (Ti), or alloys thereof), but the inventive concept is not limited to this example.

The antenna pattern 400 may have antenna wires 404 for electrical connection to respective ones of the patch patterns 402. For example, as shown in FIG. 3, each patch pattern of the patch patterns 402 may be connected to a corresponding antenna wire of the antenna wires 404, which is extended from a portion of the patch pattern 402 toward the side surface 300*a* of the mold layer 300 adjacent thereto. Each of the antenna wires 404 may be extended from one of the patch patterns 402 to a corresponding one of the trenches T adjacent thereto. For example, the antenna wire 404 may be a line-shaped pattern that is extended from one of the patch patterns 402 to a corresponding one of the trenches T. However, the planar shape of the antenna wires 404 is not limited to the linear shape and may be changed to other shapes (e.g., a curved line shape), depending on the arrangement of the patch patterns 402 and the trenches T. One of the patch patterns 402 adjacent to the corner 300*e* of the mold layer 300 may be connected to a pair of antenna wires 404, which are respectively extended to two different side surfaces 300*a* of the mold layer 300. As an example, when the patch pattern 402 is placed near a corner of the mold layer 300 defined by first and second side surfaces, connected with each other, of the mold layer 300, a pair of trenches T may be respectively formed in the first and second side surfaces of the mold layer 300, and a pair of antenna wires 404 may be provided to extend from the patch pattern 402 toward the pair of the trenches T, respectively. However, the inventive concept is not limited to this example, and if necessary, the patch patterns 402 may be connected to one antenna wire 404 or to two or more antenna wires 404. In the case where the antenna wires 404 are connected to a single patch pattern 402, the antenna wires 404 may be connected to respective ones of the trenches T. The antenna wires 404 may be formed of or include the same material as the patch patterns 402. For example, the antenna wires 404 may be formed of or include at least one of conductive materials (e.g., copper (Cu), aluminum (Al), silver (Ag), tin (Sn), gold (Au), nickel (Ni), lead (Pb), titanium (Ti), or alloys thereof), but the inventive concept is not limited to this example. The antenna wires 404 and the patch pattern 402 connected thereto may constitute a single object. For example, the patch patterns 402 and the antenna wires 404 may be formed of the same material as each other, and in this case, there may be no interface between the patch patterns 402 and the antenna wires 404.

In an embodiment, in the case where, as shown in FIG. 5, the trenches T include the corner trenches T-1 provided near the corners 300*e* of the mold layer 300, the patch patterns 402, which are adjacent to the corners 300*e* of the mold layer 300, may have antenna wires 404-1 extended toward the corner trenches T-1.

Referring to FIGS. 1 to 4, connection terminals 450 may be provided on the side surfaces 300*a* of the mold layer 300. Each of the connection terminals 450 may fill a corresponding one of the trenches T. Side surfaces 450*a* of the connection terminals 450 may be coplanar with the side surfaces 300*a* of the mold layer 300. For example, the side surfaces 450*a* of the connection terminals 450 may be exposed to the outside near the side surface 300*a* of the mold layer 300. In the connection terminals 450, there may be no portion protruding from the side surfaces 300*a* of the mold layer 300. The connection terminals 450 may include a conductive material. For example, the connection terminals 450 may be formed of or include at least one of metallic materials (e.g., copper (Cu)).

When viewed in the top plan view of FIG. 3, the connection terminal 450 may have the same planar shape as the trench T. For example, the connection terminal 450 may have a semi-circular planar shape. However, the inventive concept is not limited to this example, and depending on the planar shape of the trench T, the connection terminal 450 may be provided to have at least one of various shapes (e.g., rectangular shape), when viewed in a plan view.

When viewed in the side view of FIG. 4, the connection terminals 450 may have a line shape extended in a direction perpendicular to the package substrate 100. The connection terminals 450 may be extended along the trenches T and may be coupled to the second substrate pads 124 of the package substrate 100. For example, bottom ends of the connection terminals 450 may be in contact with top surfaces of the second substrate pads 124. The connection terminals 450 may be extended toward the top surface of the mold layer 300. Here, top ends of the connection terminals 450 may be extended to a level higher than the top surface of the mold layer 300 and may be connected to the antenna wires 404 adjacent thereto. The patch patterns 402 of the antenna pattern 400 may be electrically connected to the package substrate 100 through the antenna wires 404 and the connection terminals 450. Thus, the antenna pattern 400 may be connected to the semiconductor chip 200 or the outer terminals 105 through the connection terminals 450 and the package substrate 100. In the case where various components for driving the semiconductor chip 200 and for signal transmission and reception are mounted on the package substrate 100, the antenna pattern 400 may be connected to such components and the semiconductor chip 200 through the connection terminals 450 and the package substrate 100.

In addition, depending on the arrangement of the trenches T, the connection terminals 450 may be disposed to be spaced apart from the corners 300*e* of the mold layer 300. For example, the connection terminal 450 may be disposed adjacent to a center region of the side surface 300*a* of the mold layer 300 or between the center region of the side surface 300*a* and the corner 300*e*.

In some embodiments, some connection terminals (e.g., 450-1) of the connection terminals 450 may be disposed at the corners 300*e* of the mold layer 300, as shown in FIG. 5. For example, each of the connection terminals 450-1 may be disposed between two side surfaces 300*a* of the mold layer 300 meeting each other and may be in contact with both of the side surfaces 300*a*. When viewed in a plan view, each of the connection terminals 450-1 may have a sector shape whose two sides are parallel to the side surfaces 300*a* of the mold layer 300, respectively. In an embodiment, the sector shape may be a sector shape of a circle. Accordingly, each of the connection terminals 450-1 may have side surfaces, which are exposed to the outside, near the side surfaces 300*a* of the mold layer 300, and each of the side surfaces is coplanar with a corresponding one of the side surfaces 300*a* of the mold layer 300.

According to some embodiments of the inventive concepts, the connection terminals 450, which are used to connect the antenna pattern 400 to the package substrate 100, may be disposed to be adjacent to the antenna pattern 400. In addition, when viewed in a plan view, the mold layer 300 and the package substrate 100 may not be provided outside the connection terminals 450. Accordingly, it may be possible to reduce a planar area, which is occupied by the mold layer 300 and the package substrate 100, and thereby to reduce a size of a semiconductor package.

Figure 6:
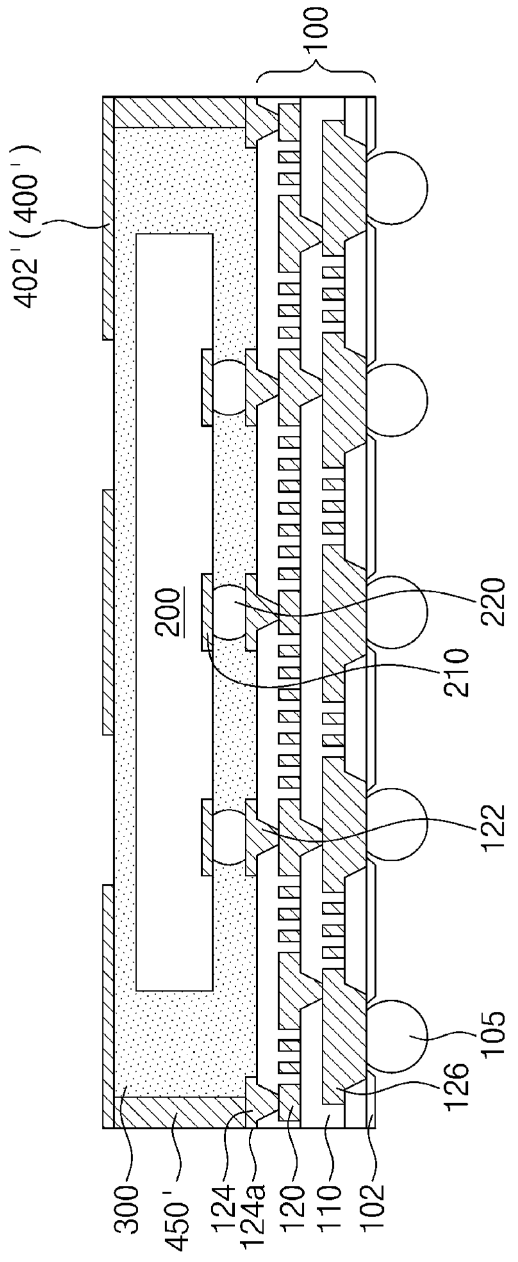
FIG. 6 is a sectional view illustrating a semiconductor package according to some embodiments of the inventive concepts.
Figure 7:
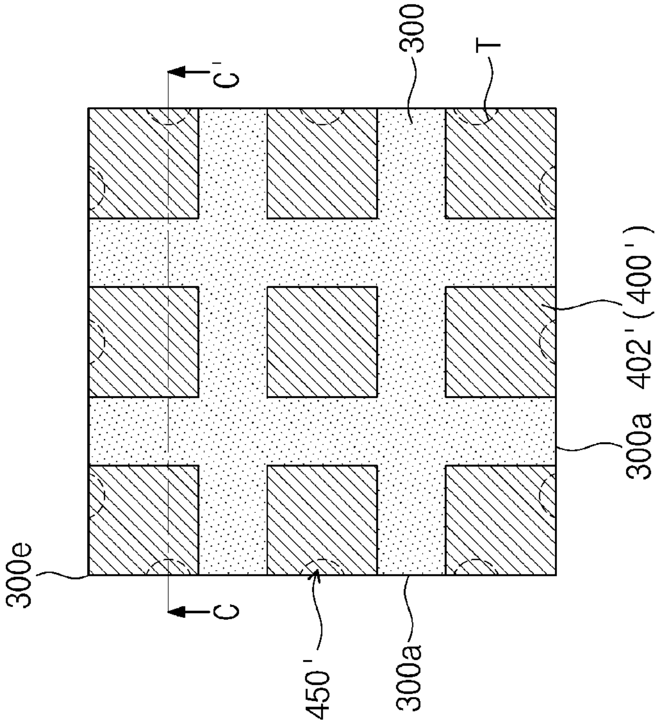
FIG. 7 is a plan view illustrating a semiconductor package according to some embodiments of the inventive concepts.

FIG. 6 is a sectional view illustrating a semiconductor package according to some embodiments of the inventive concepts. FIG. 7 is a plan view illustrating a semiconductor package according to some embodiments of the inventive concepts. FIG. 6 is a sectional view taken along line C-C' of FIG. 7. For concise description, an element previously described with reference to FIGS. 1 to 5 may be identified by the same reference number without repeating an overlapping description thereof. Technical features, which are different from those in the embodiments of FIGS. 1 to 5, will be mainly described below.

Referring to FIGS. 6 and 7, the semiconductor chip 200 may be mounted on the package substrate 100. The mold layer 300 may be provided on the package substrate 100. The mold layer 300 may cover the top surface of the package substrate 100.

The mold layer 300 may have the trenches T, which are formed at the side surfaces 300*a* of the mold layer 300. The trench T may be an empty space that is recessed from the side surface 300*a* of the mold layer 300 toward an inner portion of the mold layer 300. The trenches T may be extended from the top surface of the package substrate 100 toward the top surface of the mold layer 300 to vertically cross the mold layer 300. Each of the trenches T may be formed to expose a top surface of a corresponding one of the second substrate pads 124.

Connection terminals 450' may be provided on the side surfaces 300*a* of the mold layer 300. Each of the connection terminals 450' may be provided to fill a corresponding one of the trenches T. Side surfaces of the connection terminals 450' may be coplanar with the side surfaces 300*a* of the mold layer 300. The connection terminals 450' may have no portion protruding from the side surfaces 300*a* of the mold layer 300.

When viewed in a side view, the connection terminals 450' may have a line shape extended in a direction perpendicular to the package substrate 100. The connection terminals 450' may be extended along the trenches T and may be coupled to the second substrate pads 124 of the package substrate 100. The connection terminals 450' may be extended toward the top surface of the mold layer 300. Here, top surfaces of the connection terminals 450' may be coplanar with the top surface of the mold layer 300.

An antenna pattern 400' may be disposed on the mold layer 300. The antenna pattern 400' may be a planar antenna array, which is composed of a plurality of patch patterns 402' disposed on the top surface of the mold layer 300. The patch patterns 402' may be disposed on the entire top surface of the mold layer 300, and thus, the antenna pattern 400' may vertically overlap the semiconductor chip 200. Each of the patch patterns 402' of the antenna pattern 400' may be a patch antenna. The patch patterns 402' may be disposed on the connection terminals 450'. For example, each of the patch patterns 402' may cover a corresponding one of the connection terminals 450'. The patch patterns 402' may be directly connected to the connection terminals 450'. The patch patterns 402' of the antenna pattern 400' may be electrically connected to the package substrate 100 through the connection terminals 450'.

Figure 8:
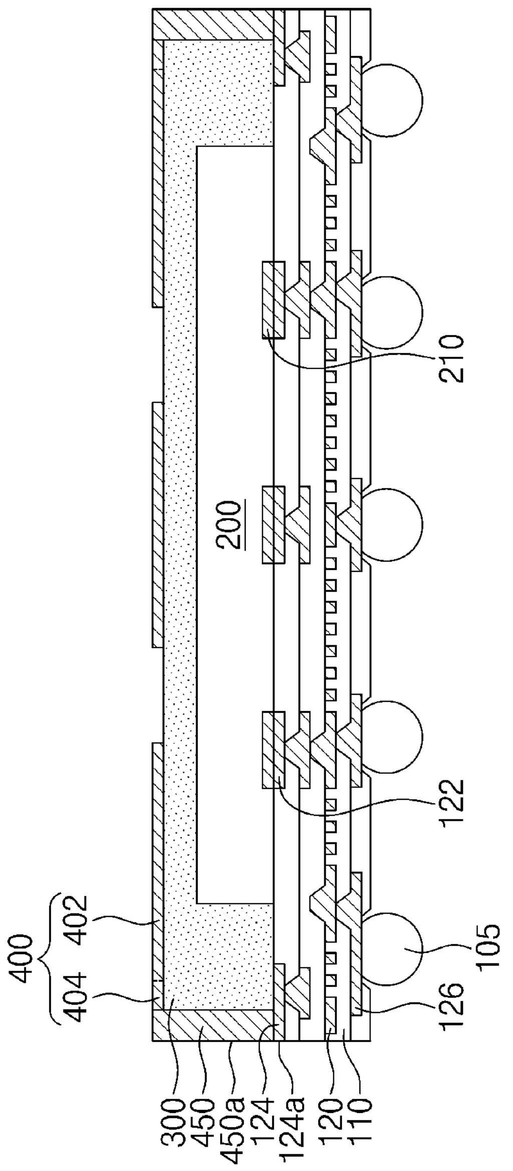
FIGS. 8 and 9 are sectional views illustrating a semiconductor package according to some embodiments of the inventive concepts.

FIG. 8 is a sectional view illustrating a semiconductor package according to some embodiments of the inventive concepts.

Referring to FIG. 8, the package substrate 100 may be provided. The package substrate 100 may be a redistribution substrate. The package substrate 100 may include two or more substrate interconnection layers which are sequentially stacked on each other. Each substrate interconnection layer may include the substrate insulating patterns 110 and substrate interconnection patterns 120, which are provided in the substrate insulating patterns 110. The substrate interconnection patterns 120 of one substrate interconnection layer may be electrically connected to the substrate interconnection patterns 120 of another substrate interconnection layer.

The substrate interconnection patterns 120 may be provided in the substrate insulating patterns 110. The substrate interconnection patterns 120 may have a damascene structure. For example, the substrate interconnection pattern 120 may include a head portion and a tail portion which are connected to form a single object. A section of the substrate interconnection pattern 120 may have an inverted shape of the letter 'T'. In each substrate interconnection layer, the head portion of the substrate interconnection pattern 120 may be buried in an upper portion of the substrate insulating pattern 110, and a top surface of the head portion of the substrate interconnection pattern 120 may be exposed to the outside of the substrate insulating pattern 110 near the top surface of the substrate insulating pattern 110. In each substrate interconnection layer, the tail portion of the substrate interconnection pattern 120 may be extended from the top surface of the head portion to penetrate the substrate insulating pattern 110 of another substrate interconnection layer thereon and may be coupled to the head portion of another substrate interconnection pattern 120. The first substrate pads 122 and the second substrate pads 124 may be provided in the substrate insulating pattern 110 of the uppermost one of the substrate interconnection layers. The tail portion of the uppermost one of the substrate interconnection patterns 120 may be coupled to a bottom surface of the first or second substrate pad 122 or 124. The head portions of the lowermost one of the substrate interconnection patterns 120 may correspond to the under-bump pads 126, which is used to attach the outer terminals 105 the package substrate 100.

The semiconductor chip 200 may be disposed on the package substrate 100. The semiconductor chip 200 may be disposed on the top surface of the package substrate 100. The semiconductor chip 200 may be mounted on the package substrate 100. For example, the front surface of the semiconductor chip 200 may face the package substrate 100. The front surface of the semiconductor chip 200 may be in contact with the top surface of the package substrate 100. Here, the chip pads 210 of the semiconductor chip 200 may be in direct contact with the first substrate pads 122 of the package substrate 100.

Figure 9:
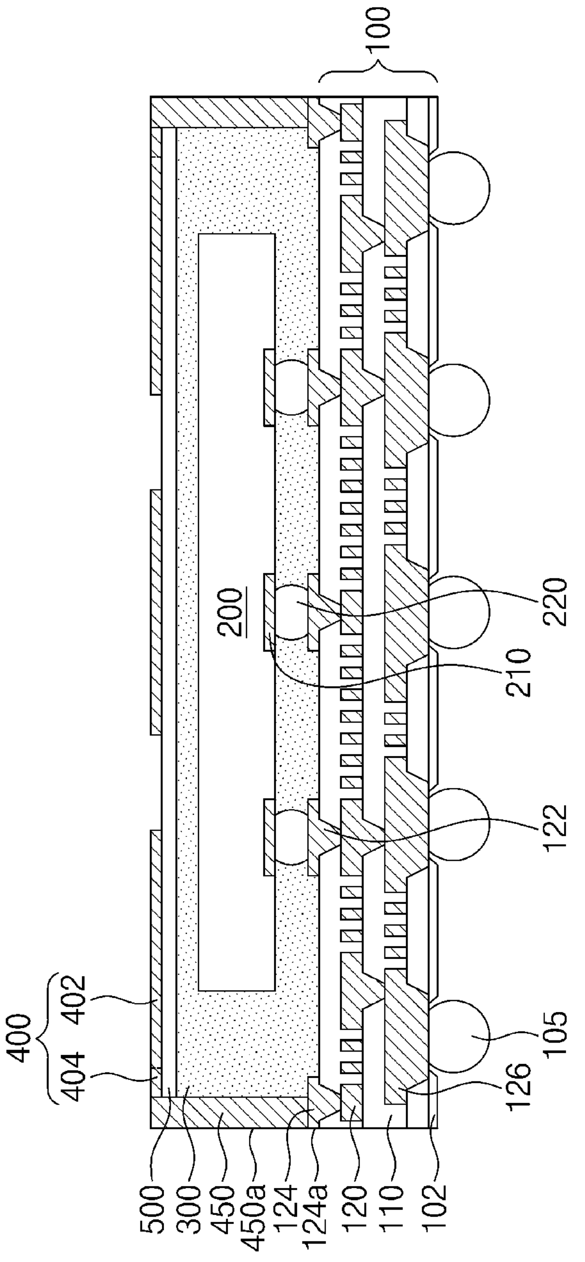

FIG. 9 is a sectional view illustrating a semiconductor package according to some embodiments of the inventive concepts.

Referring to FIG. 9, a dielectric layer 500 may be provided on the mold layer 300. The dielectric layer 500 may be formed of or include a polymer material. The dielectric layer 500 may include an insulating polymer or a photoimageable dielectric (PID). For example, the photoimageable dielectric may be formed of or include at least one of photoimageable polyimide, polybenzoxazole (PBO), phenol-based polymers, or benzocyclobutene-based polymers.

The trenches T may be provided to pass through not only the side surfaces of the mold layer 300 but also side surfaces of the dielectric layer 500. For example, the trenches T may be extended from the top surfaces of the second substrate pads 124 to a level of a top surface of the dielectric layer 500 and may pass through the mold layer 300 and the dielectric layer 500.

The antenna pattern 400 may be disposed on the dielectric layer 500. The antenna pattern 400 may be a planar antenna array that is composed of a plurality of patch patterns 402 disposed on the top surface of the dielectric layer 500.

The connection terminals 450 may be provided on the side surfaces of the mold layer 300 and the side surfaces of the dielectric layer 500. Each of the connection terminals 450 may fill a corresponding one of the trenches T. When viewed in a side view, the connection terminals 450 may have a line shape extended in a direction perpendicular to the package substrate 100. The connection terminals 450 may be extended along the trenches T and may be coupled to the second substrate pads 124 of the package substrate 100. For example, bottom ends of the connection terminals 450 may be in contact with the top surfaces of the second substrate pads 124. The connection terminals 450 may be extended toward the top surface of the dielectric layer 500. For example, the connection terminals 450 may be extended from the top surfaces of the second substrate pads 124 and may pass through the mold layer 300 and the dielectric layer 500. Here, top ends of the connection terminals 450 may protrude upward from the top surface of the dielectric layer 500 and may be connected to the antenna wires 404 adjacent thereto. The patch patterns 402 of the antenna pattern 400 may be electrically connected to the package substrate 100 through the antenna wires 404 and the connection terminals 450.

According to some embodiments of the inventive concepts, the dielectric layer 500 for adjustment of dielectric constant may be provided between the antenna pattern 400 and the semiconductor chip 200 or between the antenna pattern 400 and the package substrate 100. For example, the dielectric layer 500 between the antenna pattern 400 and the semiconductor chip 200 or between the antenna pattern and the package substrate 100 may have a reduced dielectric constant, thereby reducing a parasitic capacitance between the antenna pattern 400 and the semiconductor chip 200 or between the antenna pattern 400 and the package substrate 100. This may make it possible to improve electrical characteristics of the semiconductor package. In addition, by changing the material used for the dielectric layer 500, it may be possible to reduce a distance between the antenna pattern 400 and the semiconductor chip 200 or between the antenna pattern 400 and the package substrate 100 and thereby to reduce a size of the semiconductor package. For example, with the dielectric layer 500 on the upper surface of the mold layer 300, a thickness of the mold layer 300 may be reduced, thereby reducing a height of the semiconductor package, or the introduction of the antenna pattern 400 may not affect the height of the semiconductor package.

Figure 11:
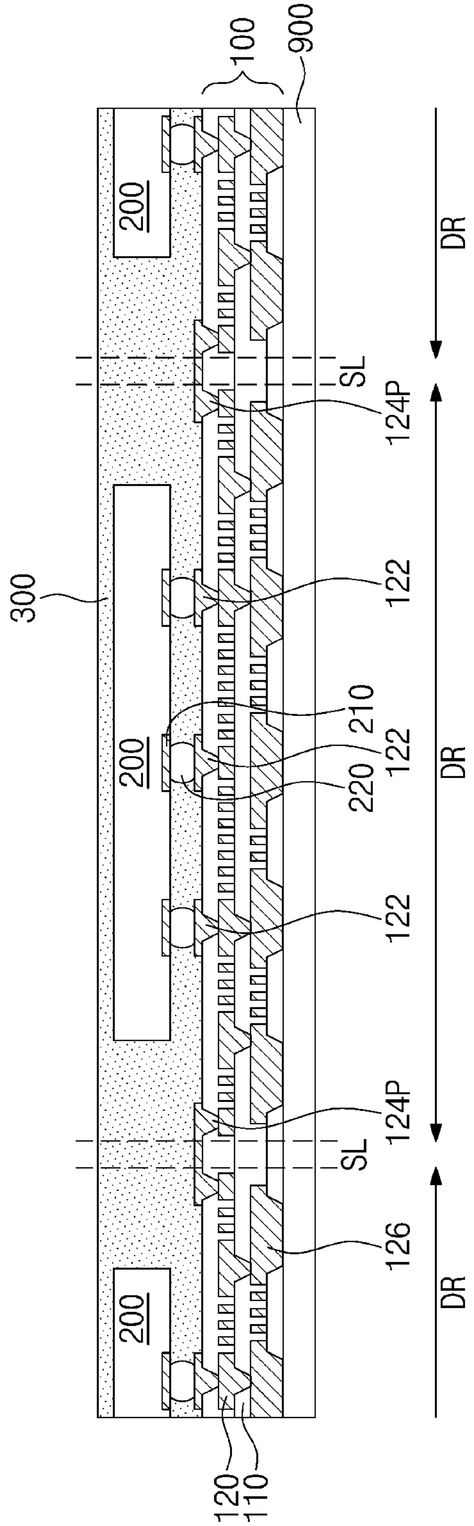
Figure 12:
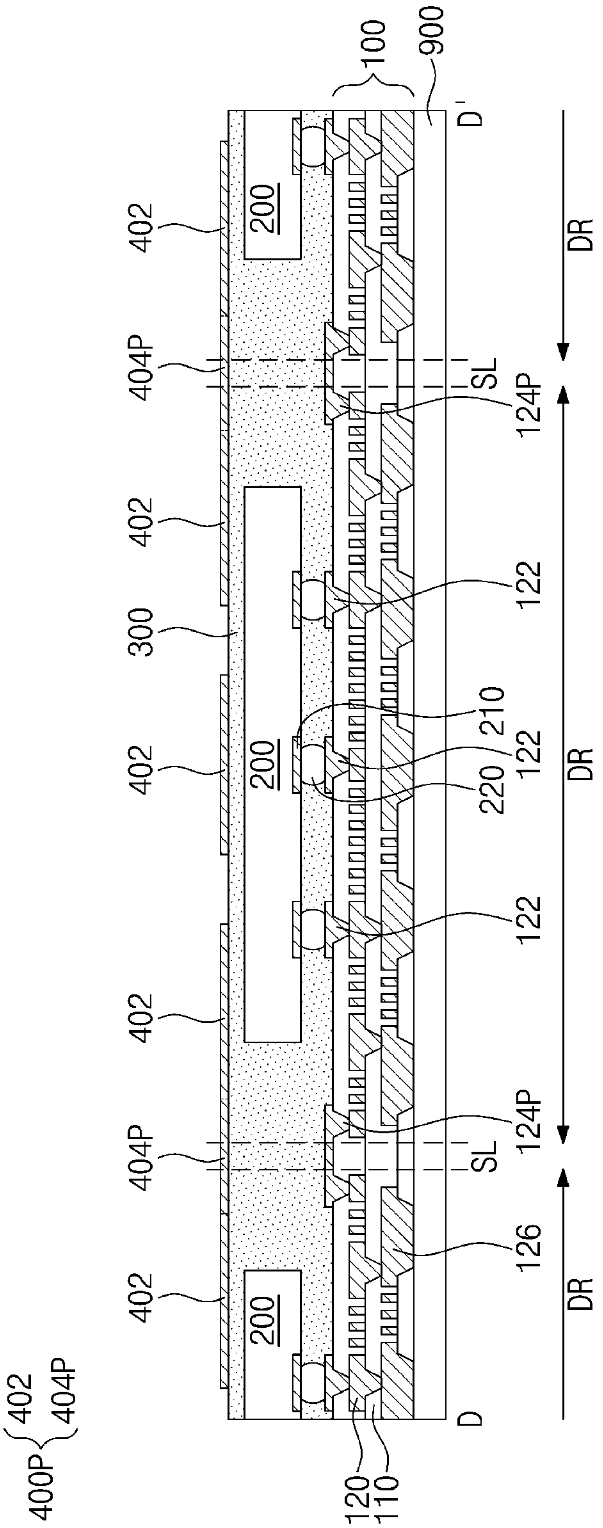
Figure 13:
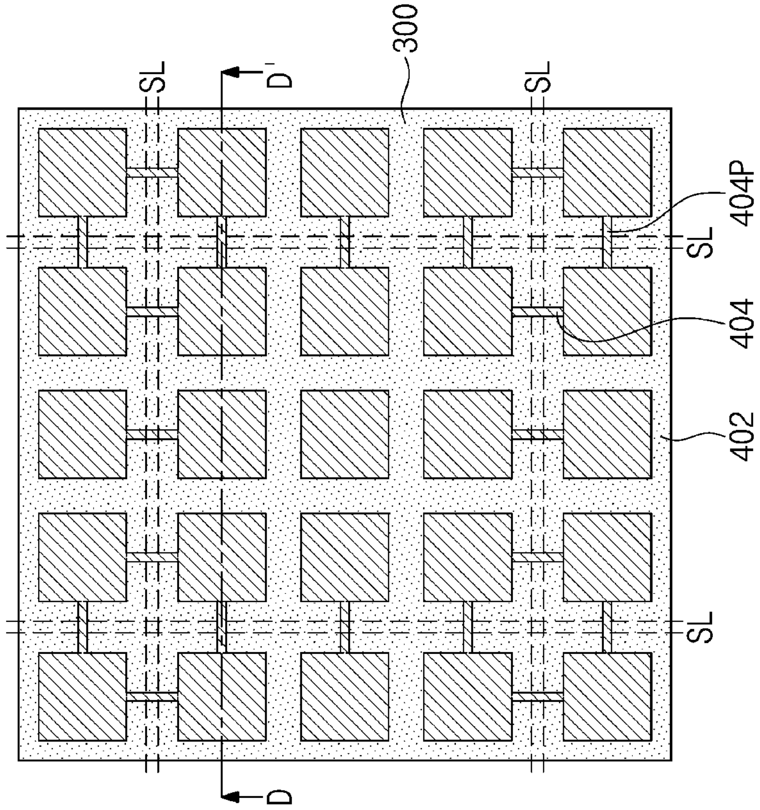
Figure 14:
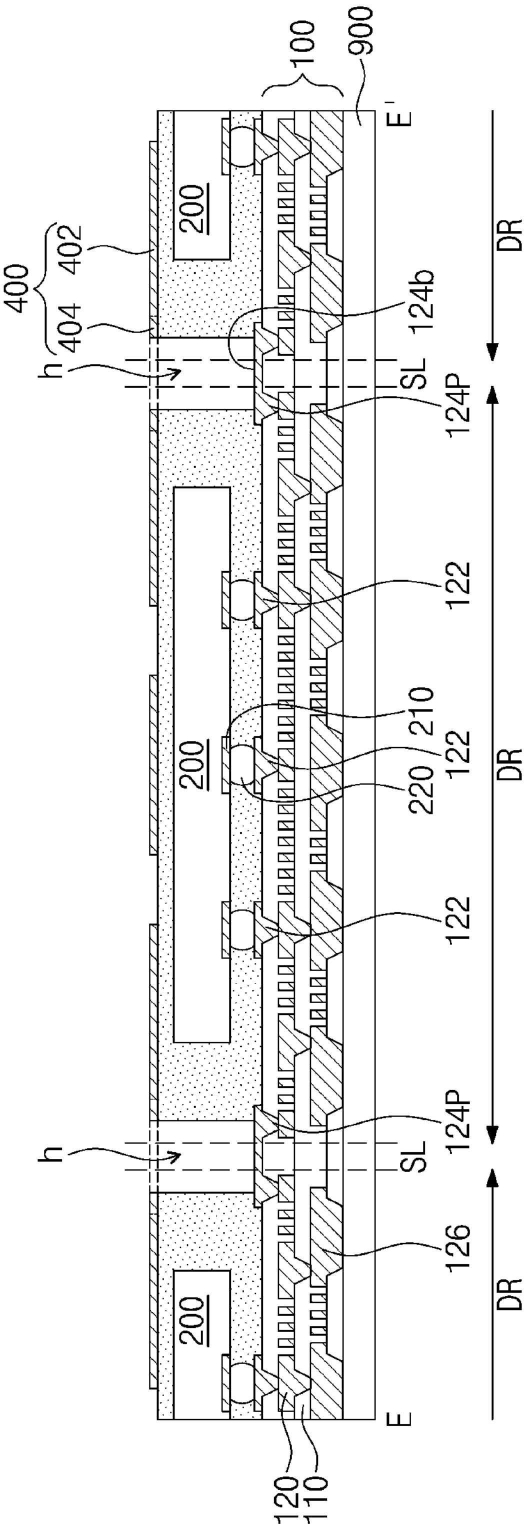
Figure 15:
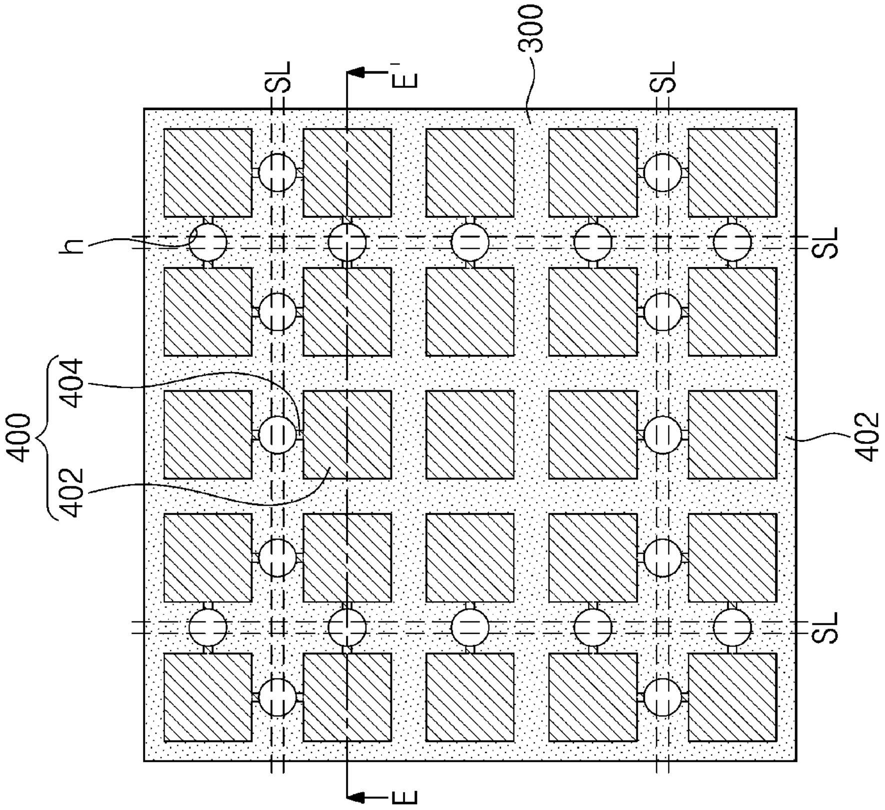
Figure 16:
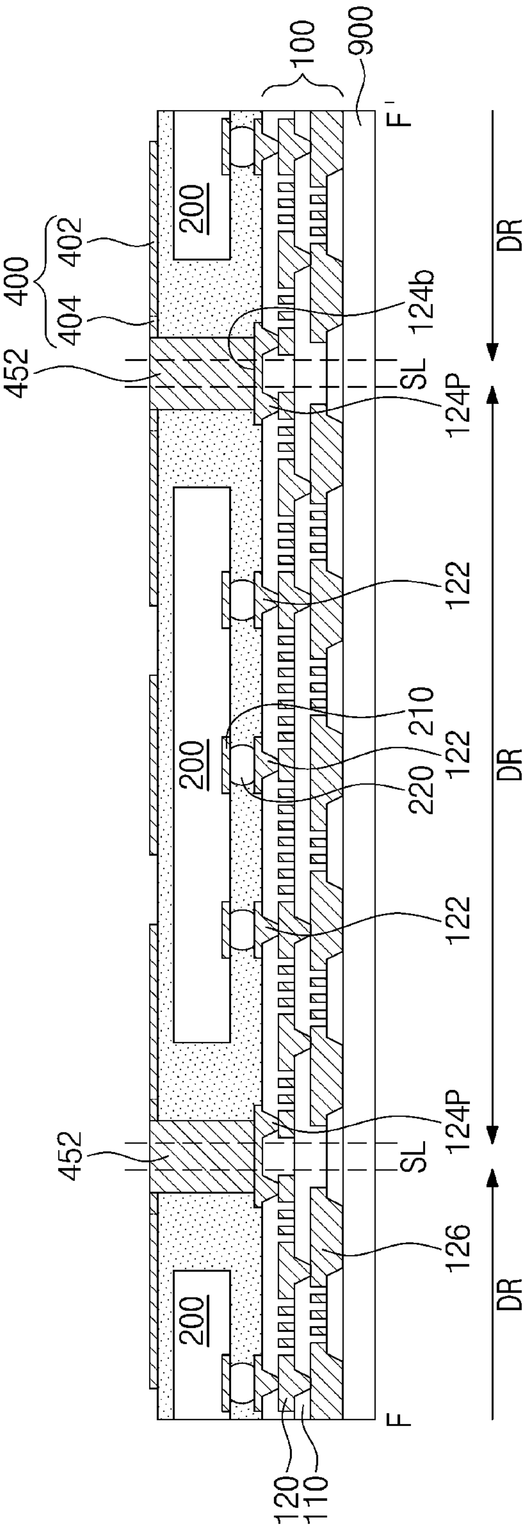
Figure 17:
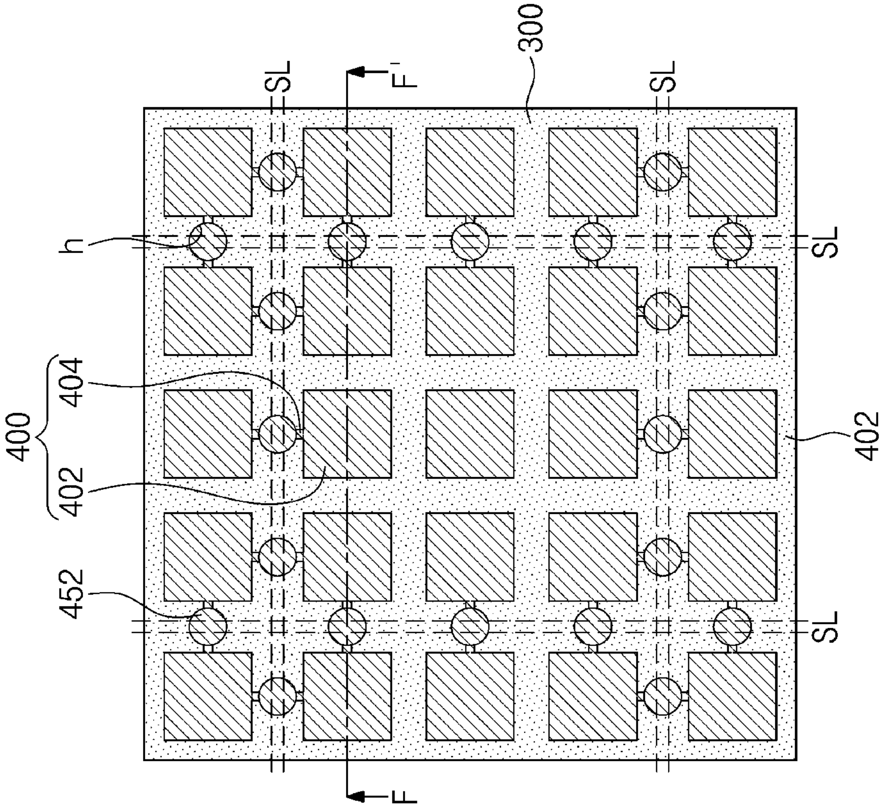
Figure 23:
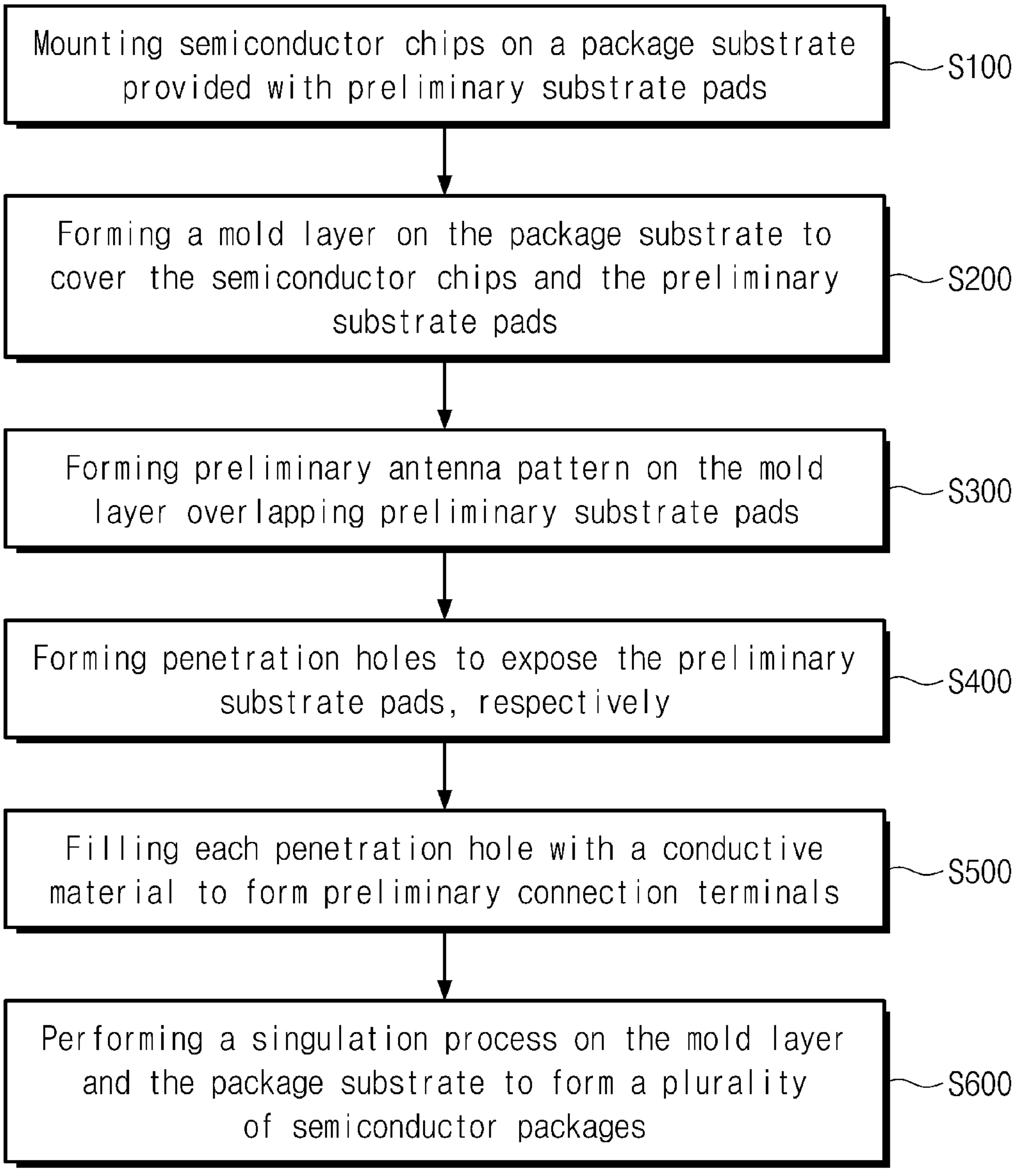
FIG. 23 is a flowchart of a method of fabricating a semiconductor package according to some embodiments of the inventive concepts.

FIGS. 10 to 18, and 23 are diagrams illustrating a method of fabricating a semiconductor package according to some embodiments of the inventive concepts. FIGS. 10 to 12, 14, 16, and 18 are sectional views illustrating a method of fabricating a semiconductor package, and FIGS. 13, 15, and 17 are plan views, each of which illustrates structures of FIGS. 12, 14, and 16 viewed from an upper level. FIG. 23 is a flowchart of a method of fabricating a semiconductor package according to some embodiments of the inventive concepts.

Figure 10:
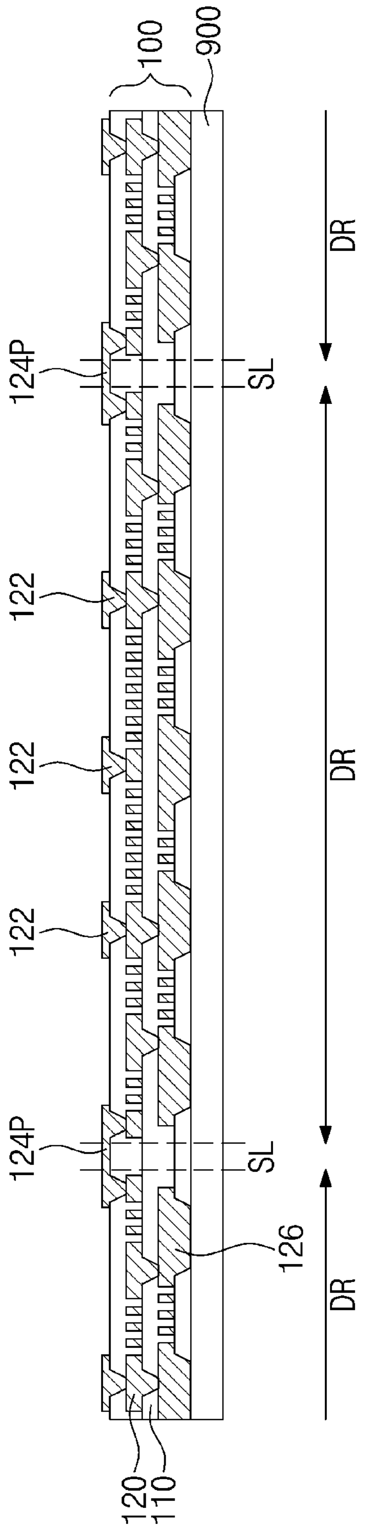
FIGS. 10 to 22 are diagrams illustrating a method of fabricating a semiconductor package according to some embodiments of the inventive concepts.

Referring to FIG. 10, a carrier substrate 900 may be provided. The carrier substrate 900 may be an insulating substrate, which is formed of or includes glass or polymer, or a conductive substrate, which is formed of or includes a metallic material. An adhesive member may be provided on a top surface of the carrier substrate 900. As an example, the adhesive member may include or may be an adhesive tape. The carrier substrate 900 may have device regions DR, which are defined by a sawing line SL, and here, each of the device regions DR may correspond to a region for a single semiconductor package. For example, each semiconductor package may be formed on a corresponding one of the device regions DR, and the device regions DR may be spaced apart from each other by the sawing line SL.

The substrate insulating pattern 110 may be formed on the carrier substrate 900. The substrate insulating pattern 110 may be formed by coating an insulating material on the carrier substrate 900 and curing the insulating material. The substrate insulating pattern 110 may cover the top surface of the carrier substrate 900. The insulating material may include or may be a photoimageable insulating material (PID).

The substrate insulating pattern 110 may be patterned to form openings. The openings may be formed to expose the top surface of the carrier substrate 900. Each of the openings may define a region, in which the tail portion of the substrate interconnection pattern 120 will be formed.

The substrate interconnection pattern 120 may be formed on the substrate insulating pattern 110. For example, the formation of the substrate interconnection pattern 120 may include forming a seed/barrier layer on the top surface of the substrate insulating pattern 110, forming a mask pattern on the seed/barrier layer, and performing a plating process using the seed/barrier layer, which is exposed by the mask pattern, as a seed layer. Next, the mask pattern and the seed/barrier layer thereunder may be removed.

The substrate insulating pattern 110 and the substrate interconnection pattern 120, which are formed by the process as described above, may constitute the substrate interconnection layer. The process of forming the substrate interconnection layer may be repeated to form the package substrate 100, in which the substrate interconnection layers are stacked on each other. The substrate interconnection pattern 120 of the uppermost one of the substrate interconnection layers may include the first substrate pads 122 of the package substrate 100 and a plurality of preliminary second substrate pads 124P. After a singulation process of step S600, which will be described later, the plurality of preliminary second substrate pads 124P may be cut into the second substrate pads 124 of the package substrate 100. The substrate interconnection pattern 120 of the lowermost one of the substrate interconnection layers may correspond to the under-bump pads 126.

The first substrate pads 122 may be formed on a center region of each of the device regions DR. The preliminary second substrate pads 124P may be formed near the sawing line SL. In more detail, the preliminary second substrate pads 124P, which are provided on adjacent ones of the device regions DR, may be formed to pass through the sawing line SL and may be connected with each other. For example, the preliminary second substrate pads 124P may be extended from one of the device regions DR to another one of the device regions DR through the sawing line SL. In other words, each of the preliminary second substrate pads 124P, when viewed in a plan view, may be formed to overlap not only an adjacent pair of the device regions DR but also a boundary between the adjacent pair of the device regions DR, and the sawing line SL may be defined as a region between the adjacent pair of the device regions DR to pass through a portion (e.g., the center) of each of the plurality of preliminary second substrate pads 124P.

Referring to FIG. 11, the semiconductor chip 200 may be provided. The semiconductor chip 200 may have the same as or similar to that described with reference to FIGS. 1 to 4. For example, the semiconductor chip 200 may include the chip pads 210, which are provided on an active surface of the semiconductor chip 200 and are connected to the integrated circuit of the semiconductor chip 200.

The semiconductor chip 200 may be mounted on the package substrate 100 in step S100. For example, the chip terminals 220 may be provided on the chip pads 210 of the semiconductor chip 200. The semiconductor chip 200 may be aligned such that the chip terminals 220 are placed on the first substrate pads 122 of the package substrate 100, and a reflow process may be performed to connect the chip terminals 220 to the first substrate pads 122.

The mold layer 300 may be formed on the package substrate 100 in step S200. For example, a molding material may be formed on the top surface of the package substrate 100 to encapsulate the semiconductor chip 200. The mold layer 300 may be formed by hardening the molding material. The mold layer 300 may cover the side and top surfaces of the semiconductor chip 200.

Referring to FIGS. 12 and 13, a preliminary antenna pattern 400P may be formed on the top surface of the mold layer 300. For example, the preliminary antenna pattern 400P may be formed by forming a conductive layer on the top surface of the mold layer 300 and patterning the conductive layer. In some embodiments, the preliminary antenna pattern 400P may include the patch patterns 402 and preliminary antenna wires 404P that are formed by patterning the conductive layer. The antenna pattern 400 may be formed over the semiconductor chip 200. For example, the patch patterns 402 may be formed on the device region DR. The preliminary antenna wires 404P may be formed over the preliminary second substrate pads 124P. In some embodiments, each preliminary antenna wire 404P may overlap a corresponding preliminary second substrate pad 124P. According to the positions of the preliminary second substrate pads 124P, the preliminary antenna wires 404P may be located on the sawing line SL. In some embodiments, the preliminary second substrate pads 124P and the preliminary antenna wires 404P may be arranged along the sawing line SL. Here, the preliminary antenna wires 404P may connect the patch patterns 402, which are disposed on the pair of the device regions DR spaced apart from each other by the sawing line SL therebetween, with each other. In other words, the preliminary antenna wires 404P may connect the patch patterns 402, which are spaced apart from each other with the sawing line SL interposed therebetween, with each other. The preliminary antenna wires 404P may be provided on a boundary between an adjacent pair of the device regions DR to connect the patch patterns 402 on the pair of the device regions DR with each other, and the sawing line SL may be defined as a region between the pair of the device regions DR to cross the antenna wires 404. Each of the preliminary antenna wires 404P may be cut into the antenna wires 404 in a process of forming the holes h, which will be described with reference to step S400. In some embodiments, the antenna wires 404 may not be provided on the sawing line SL.

Referring to FIGS. 14 and 15, holes h may be formed in the mold layer 300 and the preliminary antenna wires 404P in step S400. For example, the formation of the holes h may include forming a mask pattern on the mold layer 300 and the preliminary antenna pattern 400P, etching the preliminary antenna wires 404P using the mask pattern as an etch mask, and then etching the mold layer 300 using the mask pattern as the etch mask again. The holes h may be formed between the semiconductor chips 200, which are adjacent to each other. For example, the holes h may be formed between opposite side surfaces of the semiconductor chips 200, which are adjacent to each other. The holes h may be formed between the patch patterns 402, which are adjacent to each other with the sawing line SL interposed therebetween. Here, the holes h may be provided on the sawing line SL, and a width of the hole h may be larger than a width of the sawing line SL. Thus, the sawing line SL may be formed to cross each of the holes h. The holes h may be penetration holes, which are formed to vertically penetrate the preliminary antenna wires 404P and the mold layer 300 from top to bottom. For example, the holes h may be formed to penetrate the preliminary antenna wires 404P and the mold layer 300 and to expose top surfaces 124*b* of the preliminary second substrate pads 124P. In some embodiments, the holes h may penetrate the preliminary antenna wires 404P to form the antenna wires 404 as described with reference to FIGS. 1 to 4. In some embodiments, the holes h may cut each of the preliminary antenna wires 404P into two antenna wires 404, which are disposed in two adjacent device regions DR, respectively. The dielectric layer 500 may be formed on the mold layer 300, similar to the embodiment of FIG. 9, and in this case, the holes h may be formed to penetrate both of the dielectric layer 500 and the mold layer 300.

Referring to FIGS. 16 and 17, conductive layers 452 may be formed in the holes h in step S500. For example, a plating process may be performed to fill the holes h with a conductive material. The conductive layers 452 may be in contact with the top surfaces 124*b* of the preliminary second substrate pads 124P in the holes h. Top surfaces of the conductive layers 452 may be located at a level higher than the top surface of the mold layer 300. Accordingly, the conductive layers 452 may be in contact with side surfaces of the antenna wires 404, which are defined by inner side surfaces of the holes h. In other words, the patch patterns 402 of the preliminary antenna pattern 400P may be connected to the preliminary second substrate pads 124P through the antenna wires 404 and the conductive layers 452. The conductive layers 452 may be conductive patterns which will be used as the connection terminals 450 in a subsequent process (e.g., a singulation process of step S600).

According to embodiments of the inventive concepts, after the forming of the holes h, the conductive layers 452 may be formed by filling the holes h with a conductive material. When the conductive layers 452 are formed, the semiconductor chip 200 and a remaining region of the package substrate 100 other than the preliminary second substrate pads 124P may not be exposed to the outside, because they are encapsulated by the mold layer 300. Thus, it may be possible to prevent the package substrate 100 and the semiconductor chip 200 from being contaminated in a plating process of forming the conductive layers 452 or in a subsequent process, and thereby to reduce a failure rate in the semiconductor package fabrication process.

Figure 18:
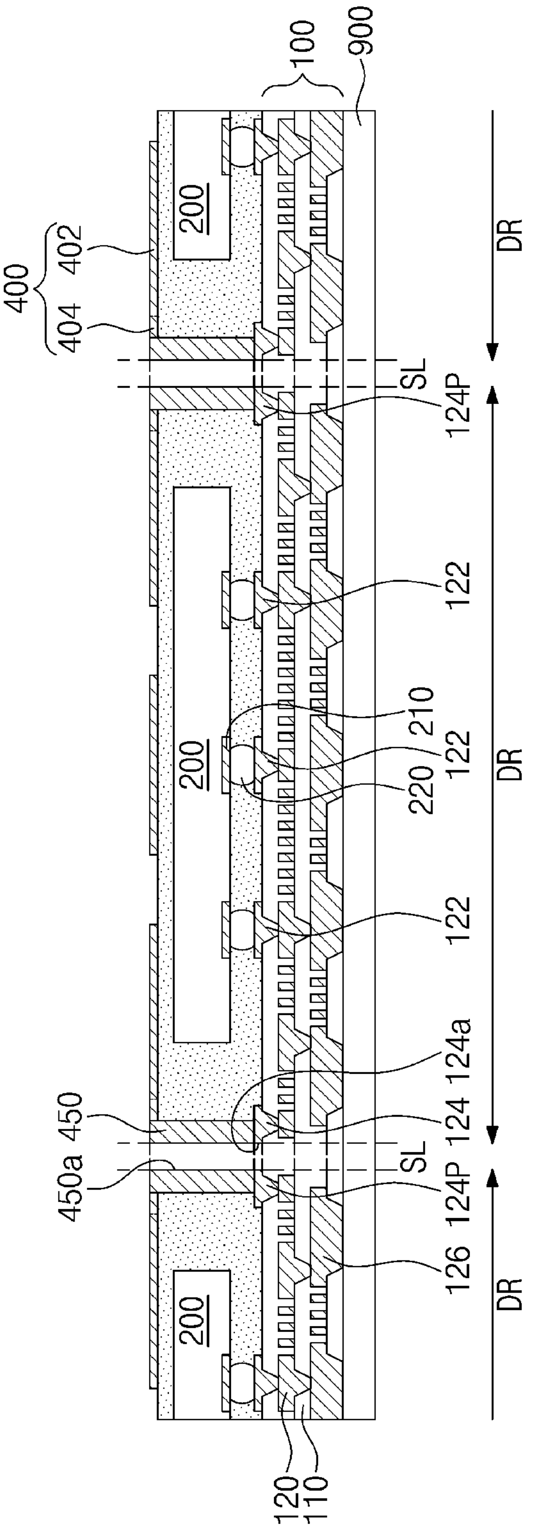

Referring to FIG. 18, a singulation process may be performed on the package substrate 100 to separate the semiconductor packages from each other in step S600. For example, the sawing process may be performed along the sawing line SL. The sawing line SL may be defined as a region between the device regions DR to cross the package substrate 100, the mold layer 300, the preliminary second substrate pads 124P, and the conductive layer 452. In some embodiments, the sawing lines SL may further cross the antenna wires 404. The package substrate 100, the mold layer 300, the preliminary second substrate pads 124P, and the conductive layer 452, which are placed on the sawing line SL, may be cut by the sawing process. In some embodiment, the antenna wires 404 may be placed on the sawing line SL, and may be cut by the sawing process. Portions of the conductive layer 452, which are cut by the sawing process, may correspond to the connection terminals 450 as described with reference to FIGS. 1 to 4. For example, the conductive layer 452 may be cut into the connection terminals 450 in the sawing process of step S600. Portions of the holes h, which are divided by the sawing process, may correspond to the trenches T as described with reference to FIGS. 1 to 4. The preliminary second substrate pads 124P may be cut into the second substrate pads 124 as described with reference to FIGS. 1 to 4. Thus, in each semiconductor package, the side surface of the package substrate 100, the side surface of the mold layer 300, the side surface of the second substrate pad 124, and the side surface of the connection terminal 450 may be located on a substantially flat plane. That is, in each semiconductor package, the side surface of the package substrate 100, the side surface of the mold layer 300, the side surface of the second substrate pad 124, and the side surface of the connection terminal 450 may be coplanar with each other to form a substantially flat plane. For example, in each semiconductor package, the side surface of the package substrate 100, the side surface of the mold layer 300, the side surface of the second substrate pad 124, and the side surface of the connection terminal 450 may be vertically aligned with each other to form a substantially flat plane. Since the conductive layer 452 is divided into two connection terminals 450 by the sawing process, a single conductive layer 452 may be used to form the connection terminals 450 for semiconductor packages adjacent to each other at the same time.

According to some embodiments of the inventive concepts, the package substrate 100 and the mold layer 300 may be cut by the singulation or sawing process, which is performed once during a semiconductor package fabrication process. In addition, a process of patterning the conductive layer 452 to form the connection terminals 450 may be performed using the singulation process or the sawing process. This may make it possible to simplify the semiconductor package fabrication process.

Referring to FIG. 1, the carrier substrate 900 may be removed to expose the bottom surface of the package substrate 100. The protection layer 102 may be formed on the bottom surface of the package substrate 100. The protection layer 102 may be patterned to expose the under-bump pads 126 of the package substrate 100, and then, outer terminals 116 may be formed on the under-bump pads 126. As a result of the afore-described fabrication process, the semiconductor package may be fabricated to have the structure of FIG. 1.

Figure 19:
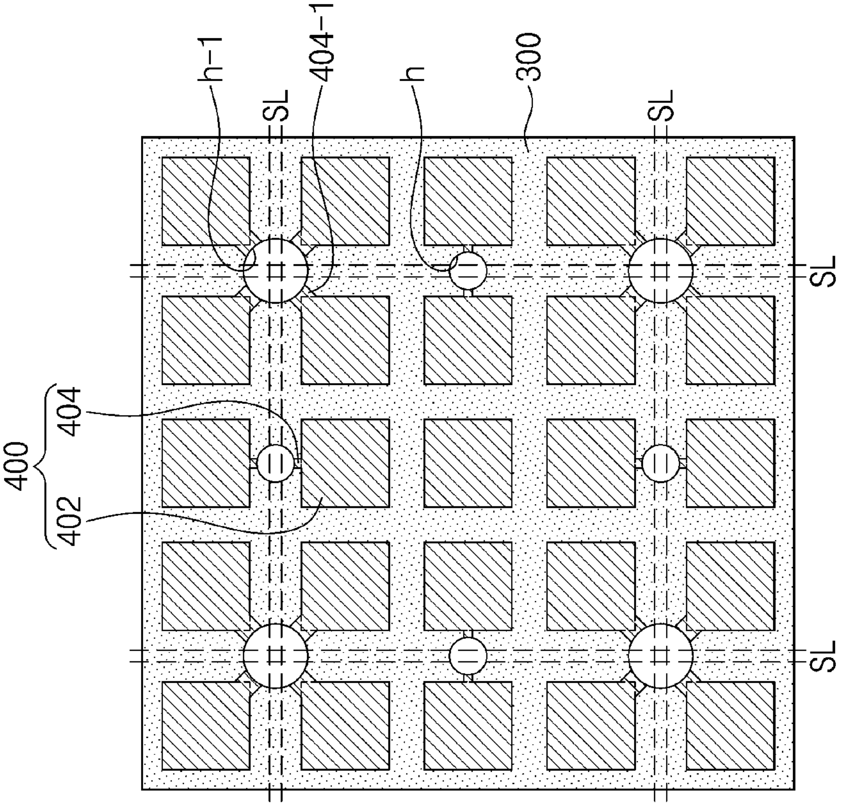
Figure 20:
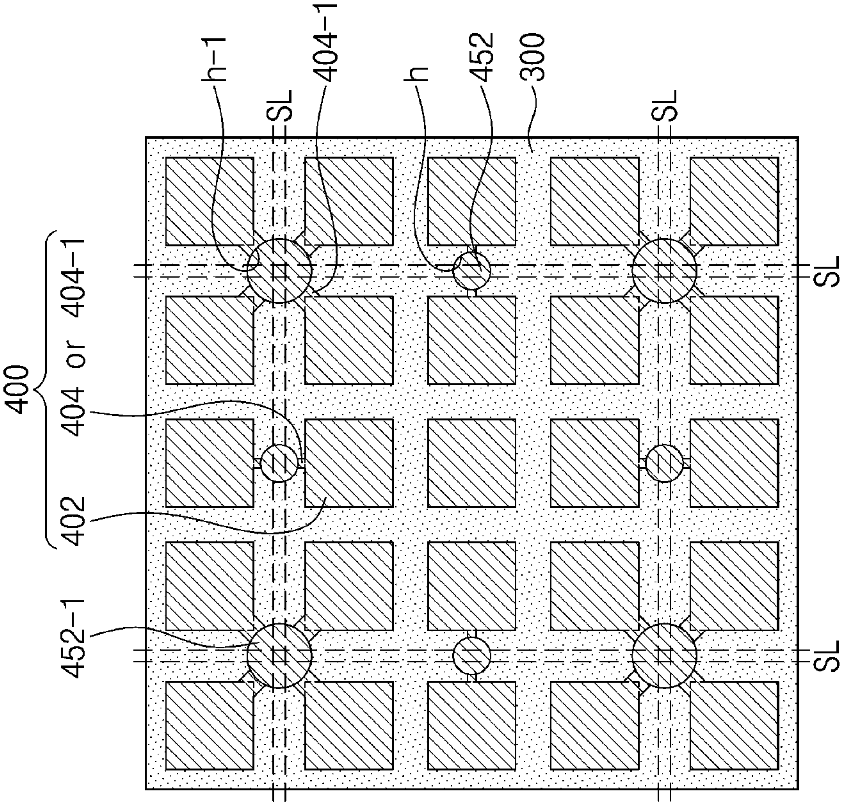

FIGS. 19 and 20 are plan views illustrating a method of fabricating a semiconductor package according to some embodiments of the inventive concepts.

Referring to FIG. 19, the antenna pattern 400 may be formed on the structure of FIG. 11 (e.g., on the top surface of the mold layer 300). For example, a conductive layer may be formed on the top surface of the mold layer 300 and may be patterned to form the patch patterns 402 and the preliminary antenna wires 404P of the antenna pattern 400. The patch patterns 402 may be formed on the device region DR. The preliminary antenna wires 404P may be formed over the preliminary second substrate pads 124P. The preliminary antenna wires 404P may connect the patch patterns 402, which are spaced apart from each other with the sawing line SL interposed therebetween, with each other.

The preliminary antenna wires 404P may include preliminary wires, which will be cut into wires 404-2 by holes h, and preliminary corner wires, which will be cut into corner wires 404-1 by holes h-1, which are adjacent to the corners of the device regions DR, and each of the preliminary corner wires may connect four patch patterns 402, which are provided in four device regions DR arranged around an intersection of the sawing lines SL, with each other. The preliminary corner wires connecting the four patch patterns 402 may have a cross shape, when viewed in a plan view. In other words, the preliminary corner wires may be provided on a boundary between four adjacent ones of the device regions DR to connect the patch patterns 402 in the four device regions DR with each other, and here, a pair of the sawing line SL may be provided between the four device regions DR to cross a corresponding one of the preliminary corner wires.

The holes h may be formed to penetrate the mold layer 300 and the preliminary wires. For example, the formation of the holes h may include forming a mask pattern on the mold layer 300 and a preliminary antenna pattern, etching the preliminary wires using the mask pattern as an etch mask to form the wires 404-2, and then etching the mold layer 300 using the mask pattern as the etch mask again. Each of the holes h may be formed between a pair of the device regions DR and between a pair of the patch patterns 402, which are adjacent to each other with the sawing line SL interposed therebetween. Here, a plurality of the holes h may be formed on the sawing line SL, and a width of the hole h may be larger than a width of the sawing line SL. Thus, the holes h may be formed to cross the sawing line SL horizontally, when viewed in a cross-sectional view. In addition, the holes h may be formed to vertically penetrate the preliminary wires and the mold layer 300 and to expose the top surfaces of the preliminary second substrate pads 124P.

The holes h may include corner holes h-1, which are adjacent to the corners of the device regions DR, and each of the corner holes h-1 may be formed at a region among four patch patterns 402, which are provided in four device regions DR arranged around an intersection of the sawing lines SL. Here, each of the corner holes h-1 may be placed on the intersection of the sawing line SL, and here, a width of the corner hole h-1 may be larger than the width of the sawing line SL. The width of the corner hole h-1 may be larger than that of remaining ones of the holes h except for the corner holes h-1.

Referring to FIG. 20, conductive layers 452 and 452-1 may be formed in the holes h and h-1, respectively. For example, a plating process may be performed to fill the holes h and h-1 with a conductive material. The conductive layers 452 and 452-1 may be in contact with the top surfaces of the preliminary second substrate pads 124P in the holes h and h-1. Top surfaces of the conductive layers 452 and 452-1 may be located at a level higher than the top surface of the mold layer 300. Accordingly, the conductive layers 452 and 452-1 may be in contact with side surfaces of the antenna wires 404-2 and 404-1, respectively, which are defined by inner side surfaces of the holes h and h-1, respectively. In other words, the patch patterns 402 of the antenna pattern 400 may be connected to the preliminary second substrate pads 124P through the antenna wires 404-2 and 404-1 and the conductive layers 452 and 452-1. The conductive layers 452 and 452-1 may be conductive patterns which will be used as the connection terminals 450 and 450-1, respectively, in a subsequent process (e.g., a singulation process).

A singulation process may be performed on the package substrate 100 to form the semiconductor packages which are separated apart from each other. For example, the sawing process may be performed along the sawing line SL. The sawing line SL may be defined as a region between the device regions DR to cross the package substrate 100, the mold layer 300, the preliminary second substrate pads 124P, and the conductive layer 452. The package substrate 100, the mold layer 300, the second substrate pads 124, and the conductive layers 452 and 452-1, which are placed on the sawing line SL, may be cut by the sawing process. Portions of the conductive layers 452 and 452-1, which are cut by the sawing process, may correspond to the connection terminals 450 and 450-1 as described with reference to FIG. 5. Portions of the holes h and h-1, which are cut by the sawing process, may correspond to the trenches T and T-1 as described with reference to FIG. 5, respectively. In some embodiments, the conductive layer 452 may be divided into two connection terminals 450 by the sawing process, and thus, a single conductive layer 452 may be used to form the connection terminals 450 for semiconductor packages adjacent to each other at the same time. The conductive layer 452 in the corner holes h-1 may be divided into four connection terminals 450-1 by the sawing process, and thus, a single conductive layer 452 may be used to form the connection terminals 450-1 for four semiconductor packages adjacent to each other at the same time.

Thereafter, the process as described with reference to FIG. 1 may be performed. For example, the carrier substrate 900 may be removed, the protection layer 102 may be formed on the bottom surface of the package substrate 100, the protection layer 102 may be patterned to expose the under-bump pads 126 of the package substrate 100, and the outer terminals 116 may be formed on the under-bump pads 126. As a result of the afore-described fabrication process, the semiconductor package may be fabricated to have the structure of FIG. 5.

Figure 21:
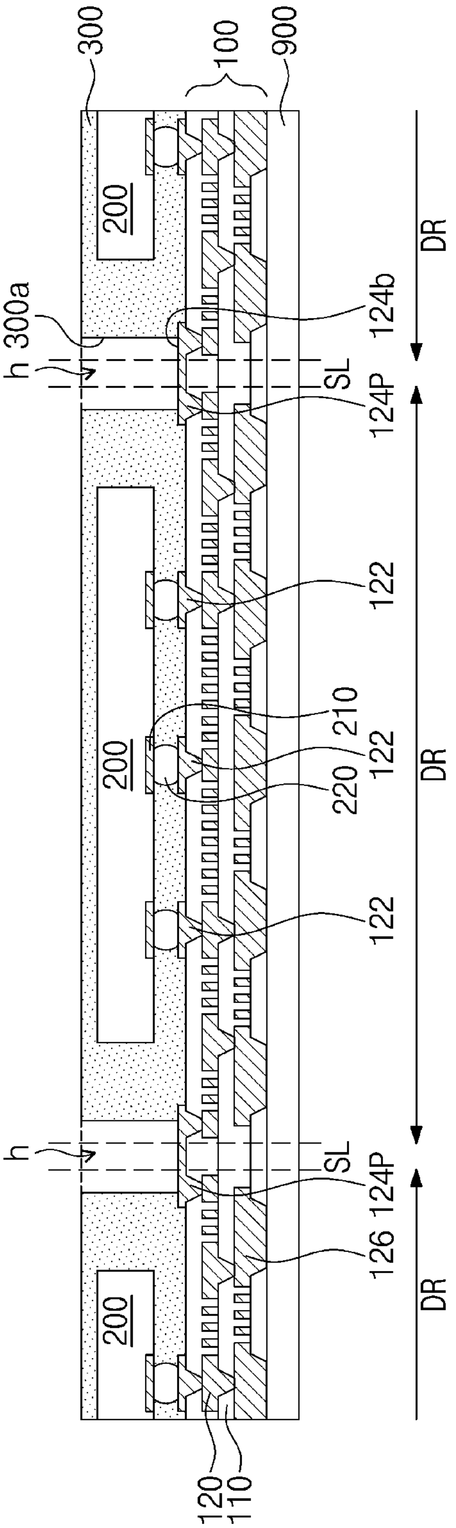
Figure 22:
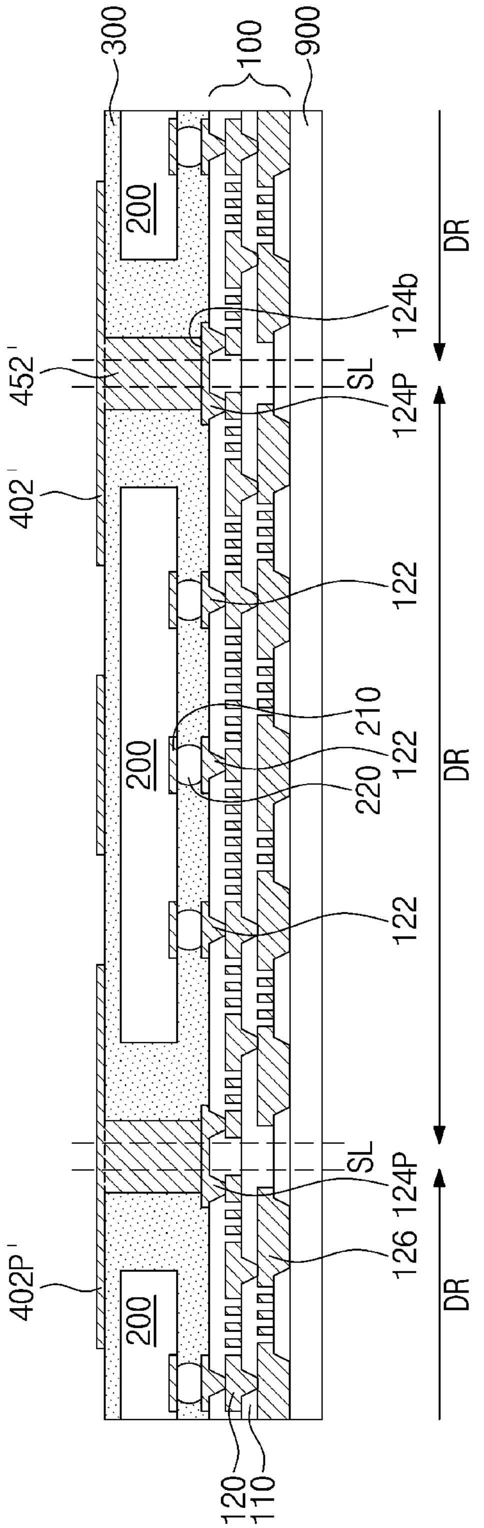

FIGS. 21 and 22 are plan views illustrating a method of fabricating a semiconductor package according to some embodiments of the inventive concepts. The method as described with reference to FIGS. 21 and 22 may be performed to fabricate the semiconductor package of FIGS. 6 and 7 having the connection terminals 450' and the patch patterns 402'.

Referring to FIGS. 6 and 21, the holes h may be formed in the mold layer 300 in the structure of FIG. 11. For example, the formation of the holes h may include forming a mask pattern on the mold layer 300 and etching the mold layer 300 using the mask pattern as an etch mask. The holes h may be formed between the semiconductor chips 200, which are adjacent to each other. For example, the holes h may be formed between opposite side surfaces of the semiconductor chips 200, which are adjacent to each other. In some embodiments, each of the holes h may be formed between opposite corners of four semiconductor chips 200, which are adjacent to each other, similar to the embodiment as described with reference to FIG. 19. Here, the holes h may be placed on the sawing line SL, and a width of the holes h may be larger than the width of the sawing line SL. Thus, the sawing line SL may be formed to cross the holes h. The holes h may be formed to vertically penetrate the mold layer 300 and to expose the top surfaces 124*b* of the preliminary second substrate pads 124P.

Referring to FIG. 22, conductive layers 452' may be formed in the holes h. For example, a plating process may be performed to fill the holes h with a conductive material. The conductive layers 452' may be in contact with the top surfaces 124*b* of the preliminary second substrate pads 124P in the holes h. Top surfaces of the conductive layers 452' may be located at a level that is equal to or higher than the top surface of the mold layer 300.

An antenna pattern may be formed on the top surface of the mold layer 300. For example, the antenna pattern may be formed by forming a conductive layer on the top surface of the mold layer 300 and patterning the conductive layer. In some embodiments, a plurality of preliminary patch patterns 402P' may be formed by patterning the conductive layer. The preliminary patch patterns 402P' may be formed on the device region DR and may be extended from one of the device regions DR to another one of the device regions DR through the sawing line SL. Here, each of the preliminary patch patterns 402P' may cover a corresponding one of the conductive layers 452'. In other words, the preliminary patch patterns 402P' may be extended from a region on a top surface of the conductive layer 452' of the sawing line SL to another region on two device regions DR adjacent to the sawing line SL. Thus, the top surface of the conductive layer 452' may be covered with the preliminary patch patterns 402P' and may not be exposed to the outside. The preliminary patch patterns 402P' may be in contact with the top surfaces of the conductive layers 452' formed in the holes h. In other words, the preliminary patch patterns 402P' may be connected to the preliminary second substrate pads 124P through the conductive layers 452'.

A subsequent process may be performed in substantially the same manner as that described with reference to FIG. 18. For example, a singulation process may be performed on the package substrate 100 to form semiconductor packages, which are separated from each other. For example, the sawing process may be performed along the sawing line SL. The sawing process may be performed to cut the package substrate 100, the mold layer 300, the preliminary second substrate pads 124P, the conductive layers 452', and the preliminary patch patterns 402P', which are placed on the sawing line SL. As shown in FIG. 6, the preliminary patch patterns 402P' may be cut into the patch patterns 402', and the preliminary second substrate pads 124P may be cut into the second substrate pads 124. Portions of the conductive layer 452', which are cut by the sawing process, may correspond to connection terminals 450'. In each semiconductor package, the side surface of the package substrate 100, the side surface of the mold layer 300, the side surface of the second substrate pad 124, the side surface of the connection terminal, and the side surface of the patch pattern 402' may be coplanar with each other to form a substantially flat plane.

Thereafter, the process described with reference to FIG. 1 may be performed. For example, the carrier substrate 900 may be removed, the protection layer 102 may be formed on the bottom surface of the package substrate 100, the protection layer 102 may be patterned to expose the under-bump pads 126 of the package substrate 100, and the outer terminals 116 may be formed on the under-bump pads 126. As a result of the afore-described fabrication process, the semiconductor package may be fabricated to have the structure of FIGS. 6 and 7.

According to some embodiments of the inventive concepts, a semiconductor package may include connection terminals, which are disposed near an antenna pattern to connect the antenna pattern to a package substrate. When viewed in a plan view, a mold layer and a package substrate may not be provided outside the connection terminals. Accordingly, it may be possible to reduce a planar area occupied by the mold layer and the package substrate and thereby to reduce a size of the semiconductor package. In some embodiments, the connection terminals may be formed in a recessed region (e.g., a trench) of the mold layer without increasing a size of the semiconductor package. The recessed region may be formed at a side surface of the mold layer or at a corner of the mold layer. Since the connection terminals are formed at the periphery of the mold layer, such arrangement of the connection terminals may not affect the other connections for the semiconductor package.

In addition, according to some embodiments of the inventive concepts, a dielectric layer may be used to reduce a parasitic capacitance between the antenna pattern and the semiconductor chip or package substrate, and in this case, it may be possible to maintain a distance between the antenna pattern and the semiconductor chip or package substrate to a small value, depending on a material of the dielectric layer. For example, with the dielectric layer 500 on the upper surface of the mold layer 300, a thickness of the mold layer 300 may be reduced, thereby reducing a height of the semiconductor package, or the introduction of the antenna pattern may not affect the height of the semiconductor package. As a result, it may be possible to realize a semiconductor package with improved electric characteristics and a small size.

According to some embodiments of the inventive concepts, the semiconductor chip and other portions of the package substrate except for substrate pads may be buried in the mold layer, before forming conductive layers, and thus, it may be possible to prevent the package substrate and the semiconductor chip from being contaminated by a subsequent process (e.g., a plating process to form the conductive layers) and thereby to reduce a failure rate in a semiconductor package fabrication process. In addition, the package substrate and the mold layer may be cut by a sawing process, which is performed once during the semiconductor package fabrication process, and a process of patterning the conductive layer to form the connection terminals shared by adjacent packages may be performed using the sawing process. This may make it possible to simplify the semiconductor package fabrication process.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor package, comprising:

a package substrate;

a semiconductor chip on the package substrate;

a mold layer on the package substrate to cover an entire top surface of the semiconductor chip, wherein the mold layer has a first side surface and a first trench disposed at the first side surface, and wherein the first trench extends from a top surface of the mold layer toward a bottom surface of the mold layer;

an antenna pattern on the mold layer;

a first connection terminal filling the first trench, wherein the antenna pattern is electrically connected to the package substrate through the first connection terminal; and a substrate pad on a top surface of the package substrate and coupled to the first connection terminal, wherein a side surface of the substrate pad is vertically aligned with a side surface of the first connection terminal, wherein the antenna pattern directly contacts an upper surface of the mold layer, wherein the antenna pattern is provided in plural, and wherein the plurality of antenna patterns are arranged periodically in rows and columns on the entire top surface of the semiconductor chip.

2. The semiconductor package of claim 1, wherein the first side surface of the mold layer exposes the side surface of the first connection terminal, and wherein the side surface of the first connection terminal is coplanar with the first side surface of the mold layer.

3. The semiconductor package of claim 1, wherein the mold layer further includes a second side surface adjacent to the first side surface, and wherein each of the first side surface and the second side surface of the mold layer is coplanar with a corresponding side surface of two adjacent side surfaces of the package substrate.

4. The semiconductor package of claim 1, wherein the mold layer has a third side surface and a second trench disposed at the third side surface, wherein the second trench has a line shape extending from the top surface of the mold layer toward the bottom surface of the mold layer, and wherein the antenna pattern is electrically connected to the package substrate through a second connection terminal filling the second trench.

5. The semiconductor package of claim 1, wherein when viewed in a plan view, the first trench is provided at a center region of the first side surface of the mold layer.

6. The semiconductor package of claim 5, wherein a top surface of the first connection terminal has a semi-circular shape, when viewed in a plan view.

7. The semiconductor package of claim 1, wherein the first trench is disposed at a corner of the mold layer, wherein the side surface of the first connection terminal has a first side surface and a second side surface connected to the first side surface and the second side surface of the mold layer, respectively, and wherein the first side surface and the second side surface of the first connection terminal are coplanar with the first side surface and the second side surface of the mold layer, respectively.

8. The semiconductor package of claim 7, wherein a top surface of the first connection terminal has a sector shape of a circle, when viewed in a plan view.

9. The semiconductor package of claim 1, wherein the side surface of the substrate pad is vertically aligned with a side surface of the package substrate.

10. The semiconductor package of claim 9, wherein the first trench exposes a top surface of the substrate pad.

11. The semiconductor package of claim 9, wherein the first connection terminal is connected to a top surface of the substrate pad.

12. A semiconductor package, comprising:

a package substrate provided with a substrate pad;

a semiconductor chip on the package substrate;

a mold layer on the package substrate to cover an entire top surface of the semiconductor chip;

an antenna pattern on the mold layer;

a first connection terminal extending along a first side surface of the mold layer toward the package substrate; and a second connection terminal extending along a second side surface of the mold layer toward the package substrate, wherein the antenna pattern is connected both to the first connection terminal and the second connection terminal, wherein the antenna pattern is provided in plural, and wherein the plurality of antenna patterns are arranged periodically in rows and columns on the entire top surface of the semiconductor chip, wherein the substrate pad includes a first side surface that is vertically aligned with the first side surface of the mold layer, and wherein the antenna pattern directly contacts an upper surface of the mold layer.

13. The semiconductor package of claim 12, wherein a top surface of the first connection terminal has a sector shape of a circle or a semicircular shape, when viewed in a plan view.

14. The semiconductor package of claim 12, wherein a side surface of the package substrate is coplanar with the second side surface of the mold layer, and wherein the substrate pad further includes a second side surface that is vertically aligned with the second side surface of the mold layer.

15. The semiconductor package of claim 12, wherein the mold layer has a first trench disposed at the first side surface and a second trench disposed at the second side surface, wherein each of the first trench and the second trench has a line shape vertically penetrating the mold layer, and wherein the first connection terminal and the second connection terminal fills the first trench and the second trench, respectively.

16. The semiconductor package of claim 15, wherein the first connection terminal has a side surface, wherein the first side surface of the mold layer is connected to the side surface of the first connection terminal, and wherein the side surface of the first connection terminal is coplanar with the first side surface of the mold layer.

17. The semiconductor package of claim 15, wherein the first trench exposes a top surface of the substrate pad, and wherein the first connection terminal is connected to the top surface of the substrate pad.

* * * * *